US009818872B2

(12) United States Patent
Ching et al.

(10) Patent No.: US 9,818,872 B2
(45) Date of Patent: Nov. 14, 2017

(54) MULTI-GATE DEVICE AND METHOD OF FABRICATION THEREOF

(71) Applicant: Taiwan Semiconductor Manufacturing Company, Ltd., Hsin-Chu (TW)

(72) Inventors: Kuo-Cheng Ching, Hsin-Chu (TW); Ching-Wei Tsai, Hsin-Chu (TW); Carlos H. Diaz, Mountain View, CA (US); Chih-Hao Wang, Hsinchu County (TW); Wai-Yi Lien, Hsinchu (TW); Ying-Keung Leung, Hong Kong (CN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 91 days.

(21) Appl. No.: 14/788,161

(22) Filed: Jun. 30, 2015

(65) Prior Publication Data
US 2017/0005195 A1    Jan. 5, 2017

(51) Int. Cl.
*H01L 29/78* (2006.01)
*H01L 29/66* (2006.01)
*H01L 29/775* (2006.01)
*H01L 29/165* (2006.01)
*H01L 29/06* (2006.01)
*H01L 29/423* (2006.01)

(52) U.S. Cl.
CPC ...... *H01L 29/7848* (2013.01); *H01L 29/0649* (2013.01); *H01L 29/0673* (2013.01); *H01L 29/0676* (2013.01); *H01L 29/165* (2013.01); *H01L 29/42392* (2013.01); *H01L 29/66439* (2013.01); *H01L 29/66537* (2013.01); *H01L 29/66545* (2013.01); *H01L 29/66795* (2013.01); *H01L 29/775* (2013.01); *H01L 29/7851* (2013.01)

(58) Field of Classification Search
CPC ............ H01L 29/0638; H01L 29/0653; H01L 29/0676; H01L 29/165; H01L 29/66439; H01L 29/66537; H01L 29/66545; H01L 29/66636; H01L 29/66795; H01L 29/775; H01L 29/7848; H01L 29/7851
See application file for complete search history.

(56) References Cited

U.S. PATENT DOCUMENTS

| | | | |
|---|---|---|---|
| 6,372,356 B1 * | 4/2002 | Thornton | B32B 15/01 257/189 |
| 7,667,271 B2 | 2/2010 | Yu et al. | |
| 8,362,575 B2 | 1/2013 | Kwok et al. | |
| 8,367,498 B2 | 2/2013 | Chang et al. | |

(Continued)

*Primary Examiner* — Robert Huber
*Assistant Examiner* — Gardner W Swan
(74) *Attorney, Agent, or Firm* — Haynes and Boone, LLP

(57) ABSTRACT

A method of semiconductor device fabrication is described that includes forming a fin extending from a substrate and having a source/drain region and a channel region. The fin includes a first epitaxial layer having a first composition and a second epitaxial layer on the first epitaxial layer, the second epitaxial layer having a second composition. The second epitaxial layer is removed from the source/drain region of the fin to form a gap. The gap is filled with a dielectric material. Another epitaxial material is formed on at least two surfaces of the first epitaxial layer to form a source/drain feature.

18 Claims, 26 Drawing Sheets

(56) References Cited

U.S. PATENT DOCUMENTS

| | | | |
|---|---|---|---|
| 8,440,517 B2 | 5/2013 | Lin et al. | |
| 8,497,171 B1 * | 7/2013 | Wu | H01L 21/823821 438/199 |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,219,154 B1 * | 12/2015 | Cheng | H01L 29/7853 |
| 9,397,102 B2 | 7/2016 | Glass et al. | |
| 9,484,447 B2 | 11/2016 | Kim et al. | |
| 2008/0135949 A1 | 6/2008 | Lo et al. | |
| 2011/0068407 A1 | 3/2011 | Yeh et al. | |
| 2013/0011983 A1 | 1/2013 | Tsai et al. | |
| 2013/0153993 A1 * | 6/2013 | Chang | B82Y 10/00 257/330 |
| 2013/0161756 A1 * | 6/2013 | Glass | H01L 29/66545 257/369 |
| 2013/0234215 A1 * | 9/2013 | Okano | H01L 29/42392 257/255 |
| 2013/0270512 A1 * | 10/2013 | Radosavljevic | H01L 21/823807 257/9 |
| 2013/0279145 A1 * | 10/2013 | Then | H01L 29/775 361/820 |
| 2013/0307513 A1 * | 11/2013 | Then | H01L 29/66469 323/311 |
| 2014/0084239 A1 * | 3/2014 | Radosavljevic | H01L 29/0665 257/12 |
| 2014/0197458 A1 | 7/2014 | Ching et al. | |
| 2014/0252412 A1 | 9/2014 | Tsai et al. | |
| 2014/0312432 A1 | 10/2014 | Ching et al. | |
| 2015/0021691 A1 | 1/2015 | Akarvardar et al. | |
| 2015/0041898 A1 * | 2/2015 | Loubet | H01L 29/785 257/347 |
| 2015/0069328 A1 * | 3/2015 | Leobandung | H01L 29/775 257/24 |
| 2015/0236120 A1 * | 8/2015 | Hashemi | H01L 29/42392 257/9 |
| 2016/0118472 A1 * | 4/2016 | Qi | H01L 29/66553 438/283 |
| 2016/0181352 A1 * | 6/2016 | Cheng | H01L 28/60 257/532 |

* cited by examiner

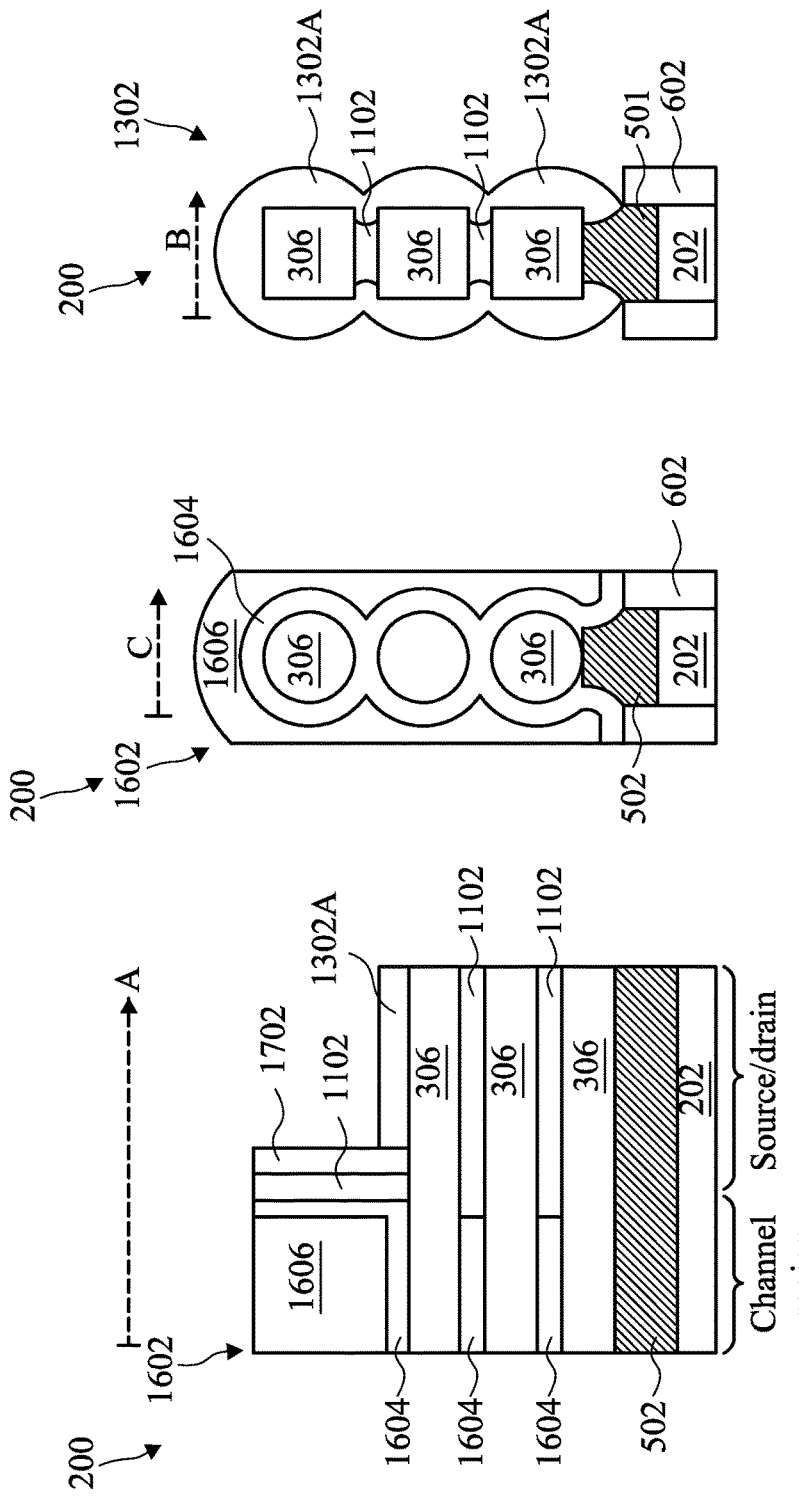

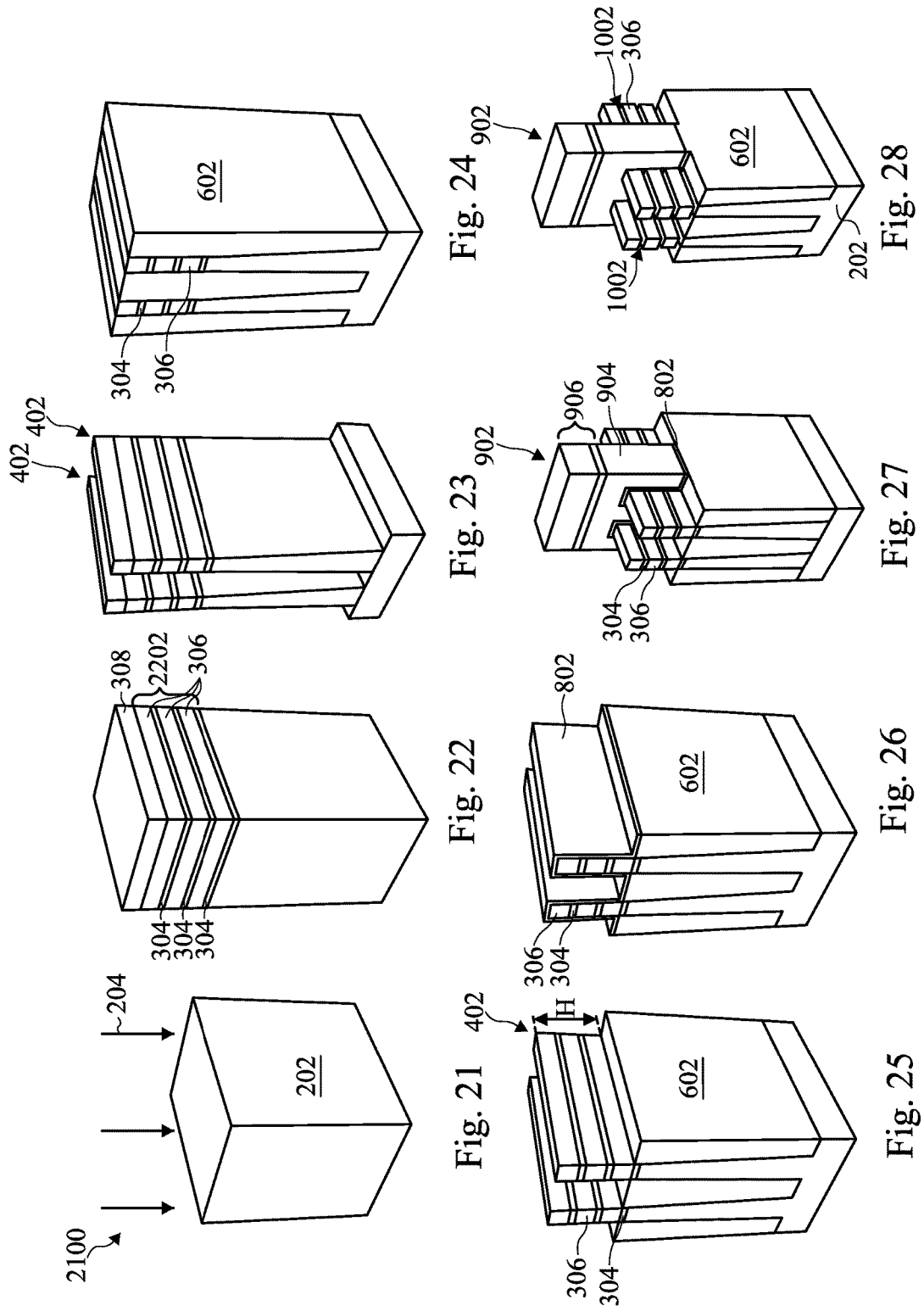

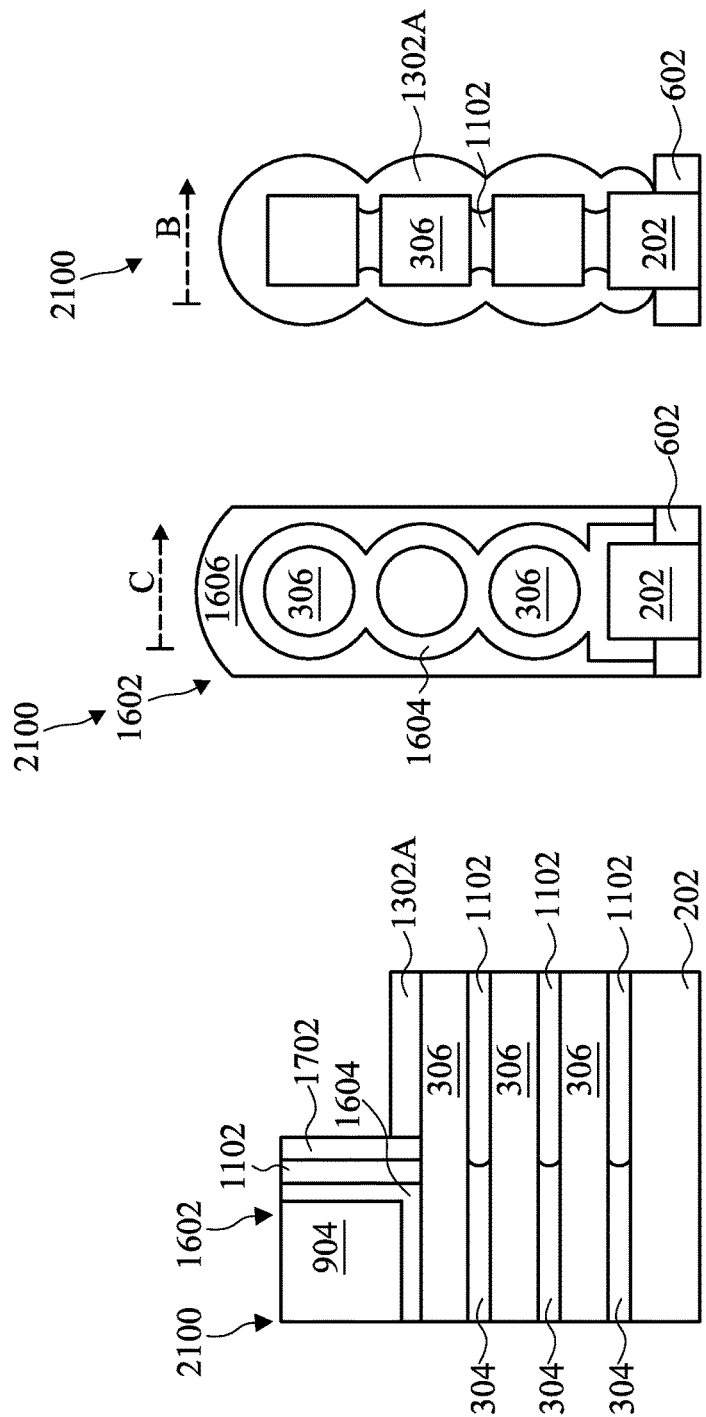

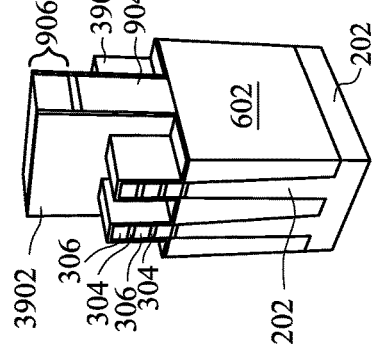
Fig. 39A
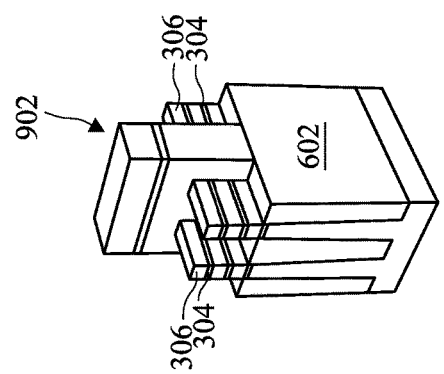
Fig. 40A
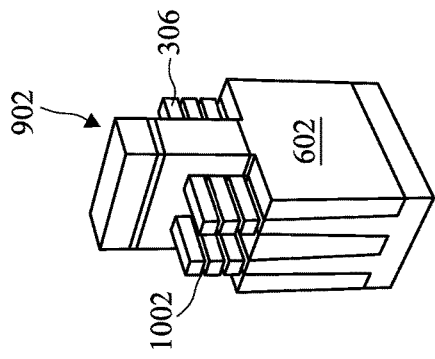
Fig. 41A
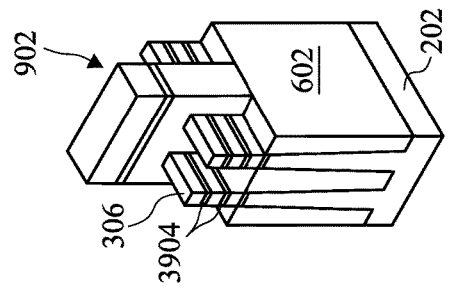
Fig. 39B
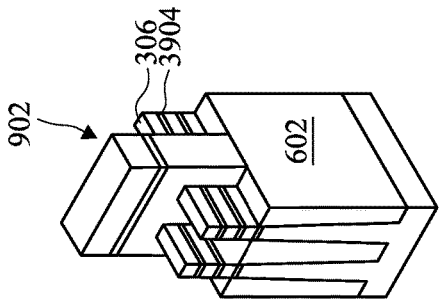
Fig. 40B
Fig. 41B

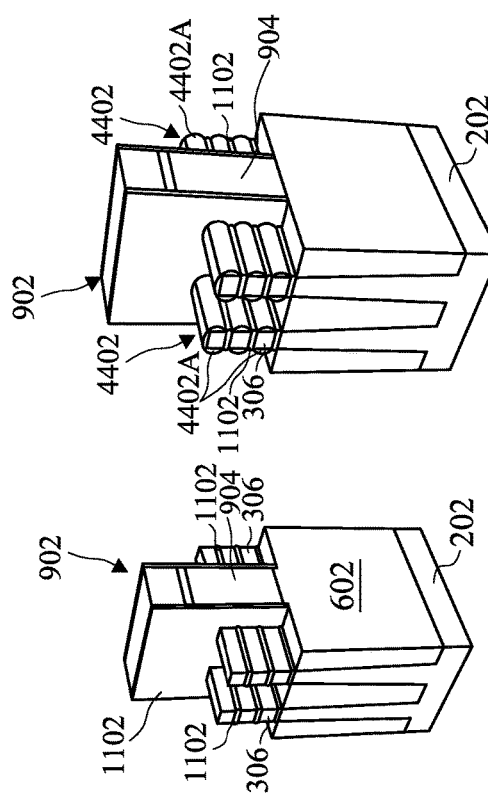
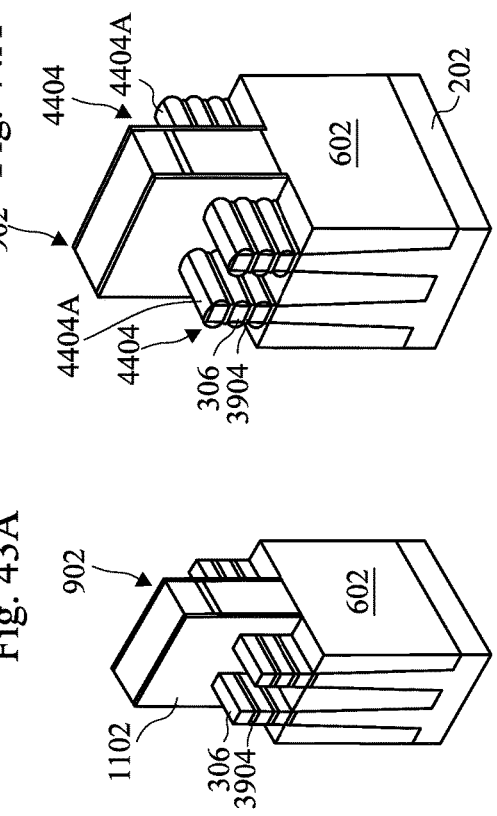
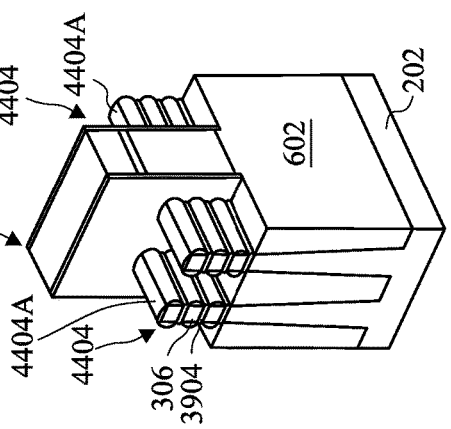
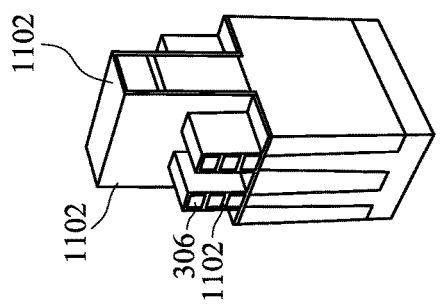
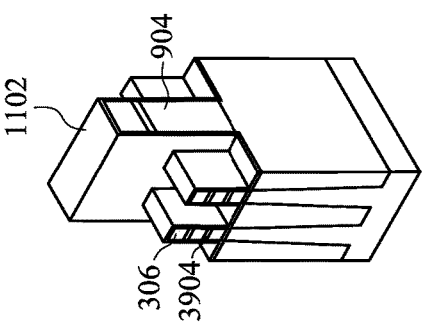
Fig. 44A
Fig. 44B
Fig. 43A
Fig. 43B
Fig. 42A
Fig. 42B

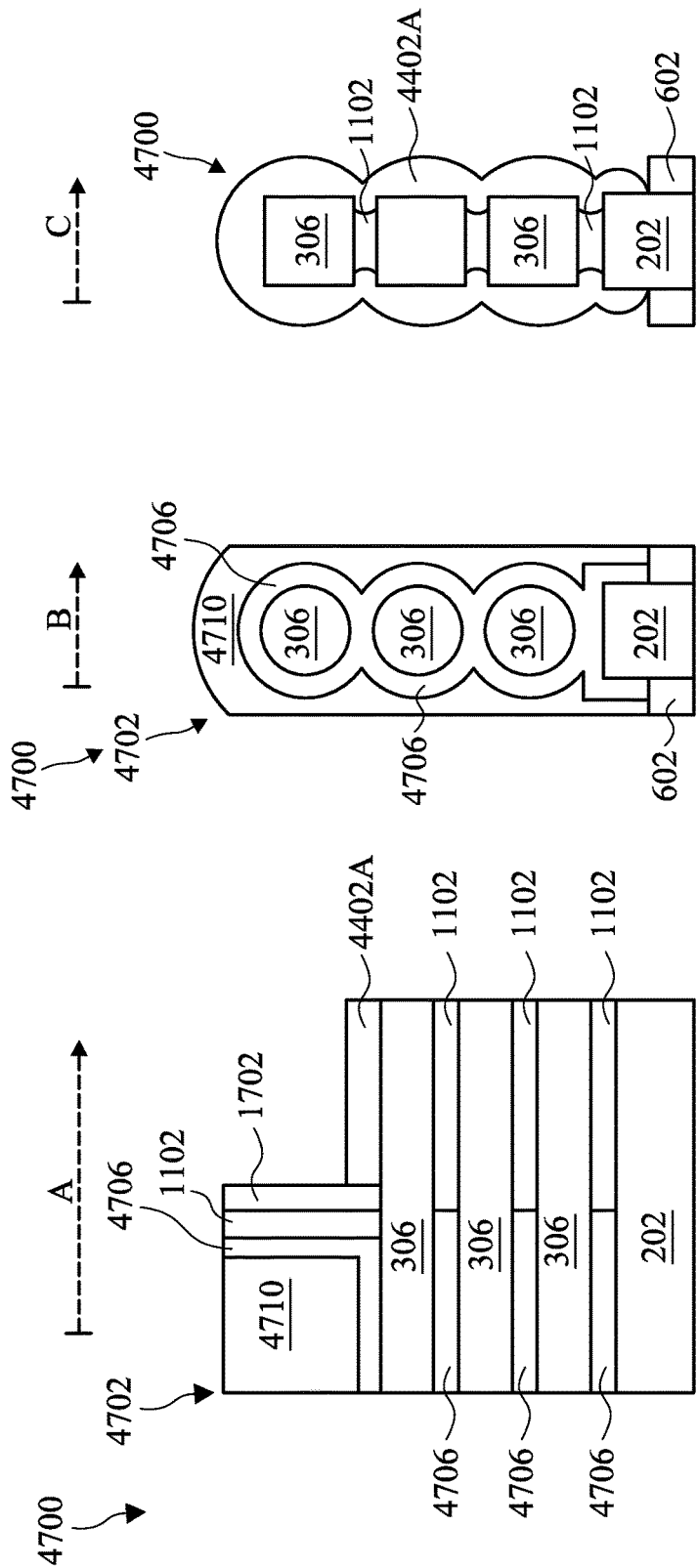

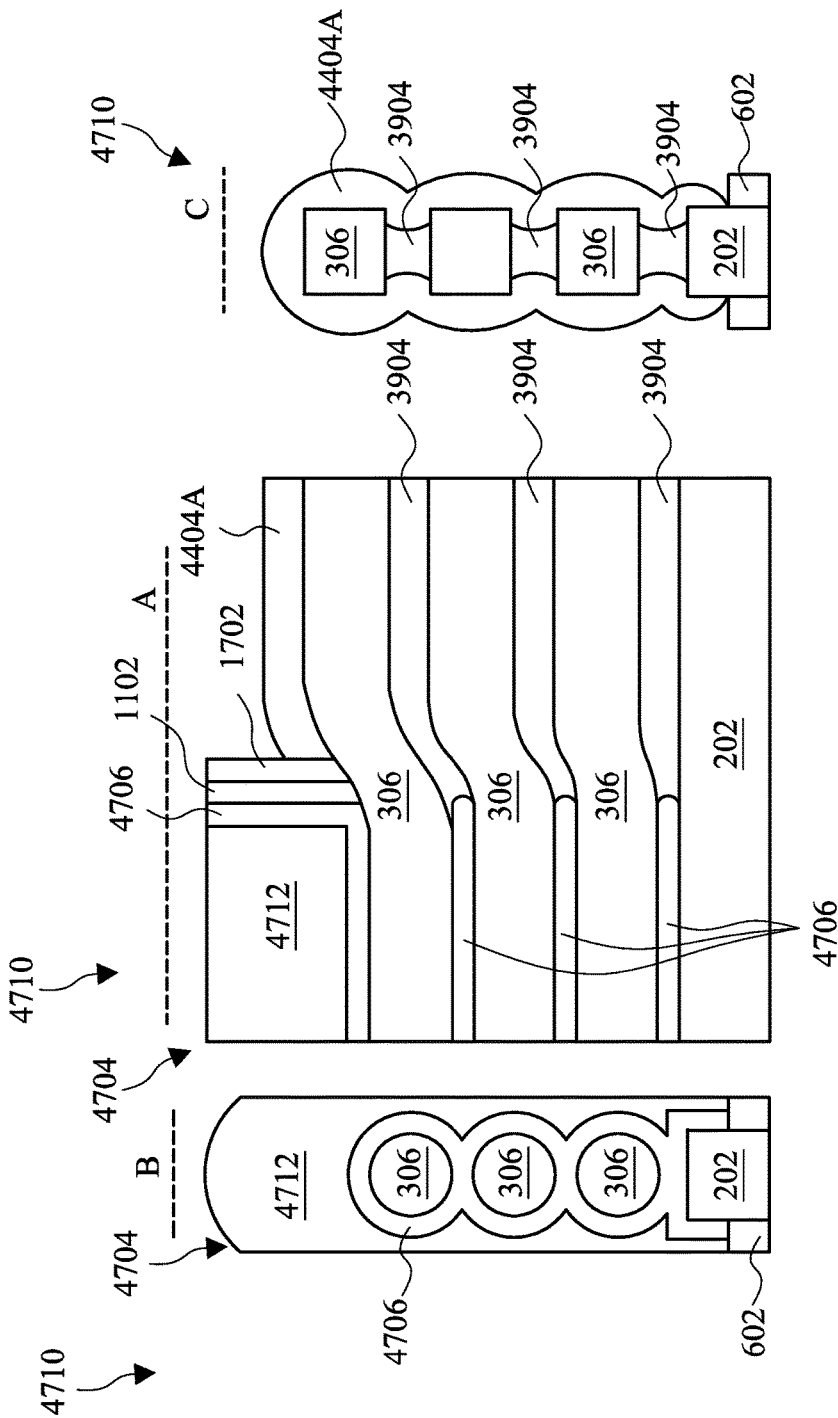

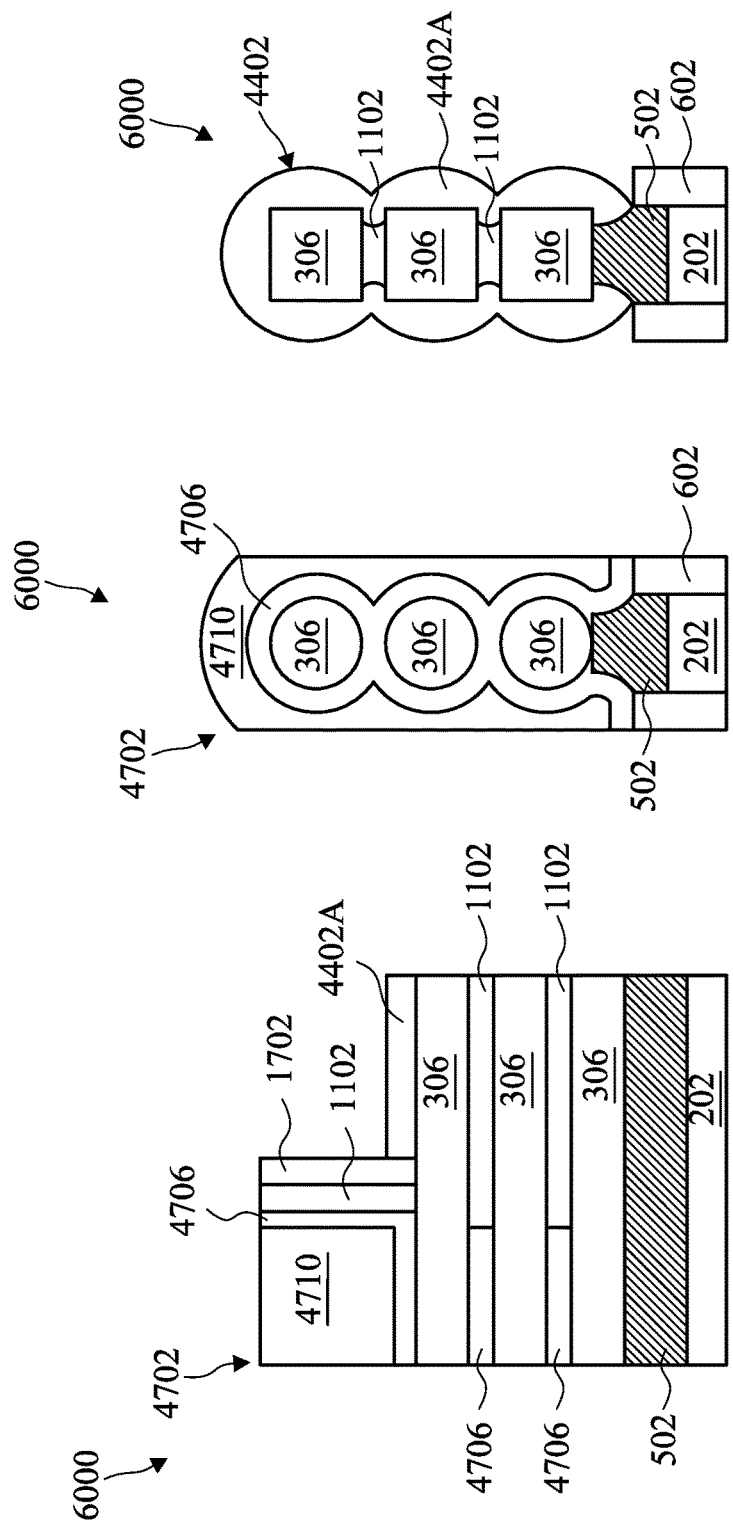

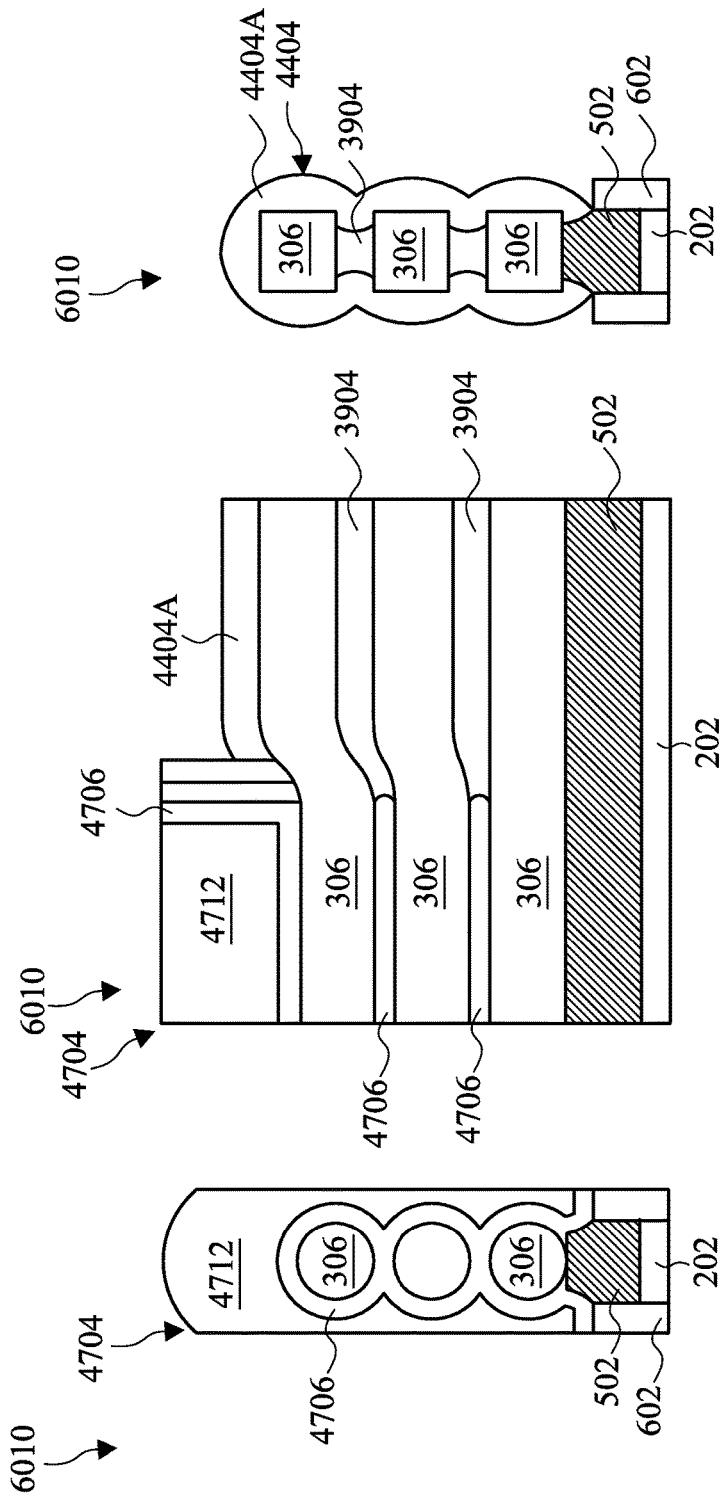

MULTI-GATE DEVICE AND METHOD OF FABRICATION THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, challenges with respect to forming strain enhancement, source/drain formation, and other features creating the current methods to not be satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12B and 17-19 are cross-section views, corresponding to respective isometric views listed above, of an embodiment of the device 200 according to aspects of the method of FIG. 1;

FIGS. 21-29, 30A, and 31-34 are isometric views of an embodiment of a device 200 according to aspects of the method of FIG. 20; and FIGS. 30B, 35, 36, and 37 are cross-section views, corresponding to respective isometric views listed above, of an embodiment of the device according to aspects of the method of FIG. 20;

FIGS. 39A, 40A, 41A, 42A, 43A, 44A, 45A, 46A, 47A are isometric views of an embodiment of a device of a first type according to aspects of the method of FIG. 38; FIGS. 39B, 40B, 41B, 42B, 43B, 44B, 45B, 46B, 47B are isometric views of an embodiment of a device of a second type according to aspects of the method of FIG. 38;

FIGS. 48A, 49A, 50A are cross-sectional views, corresponding to respective isometric views listed above, of an embodiment of a device of a first type according to aspects of the method of FIG. 38; FIGS. 48B, 49B, 50B, are cross-sectional views, corresponding to respective isometric views listed above, of an embodiment of a device of a second type according to aspects of the method of FIG. 38;

FIGS. 61A, 62A, 63A are cross-sectional views, corresponding to respective isometric views listed above, of an embodiment of a device of a first type according to aspects of the method of FIG. 51; FIGS. 61B, 62B, 63B, are cross-sectional views, corresponding to respective isometric views listed above, of an embodiment of a device of a second type according to aspects of the method of FIG. 51.

DETAILED DESCRIPTION

Figure 1:
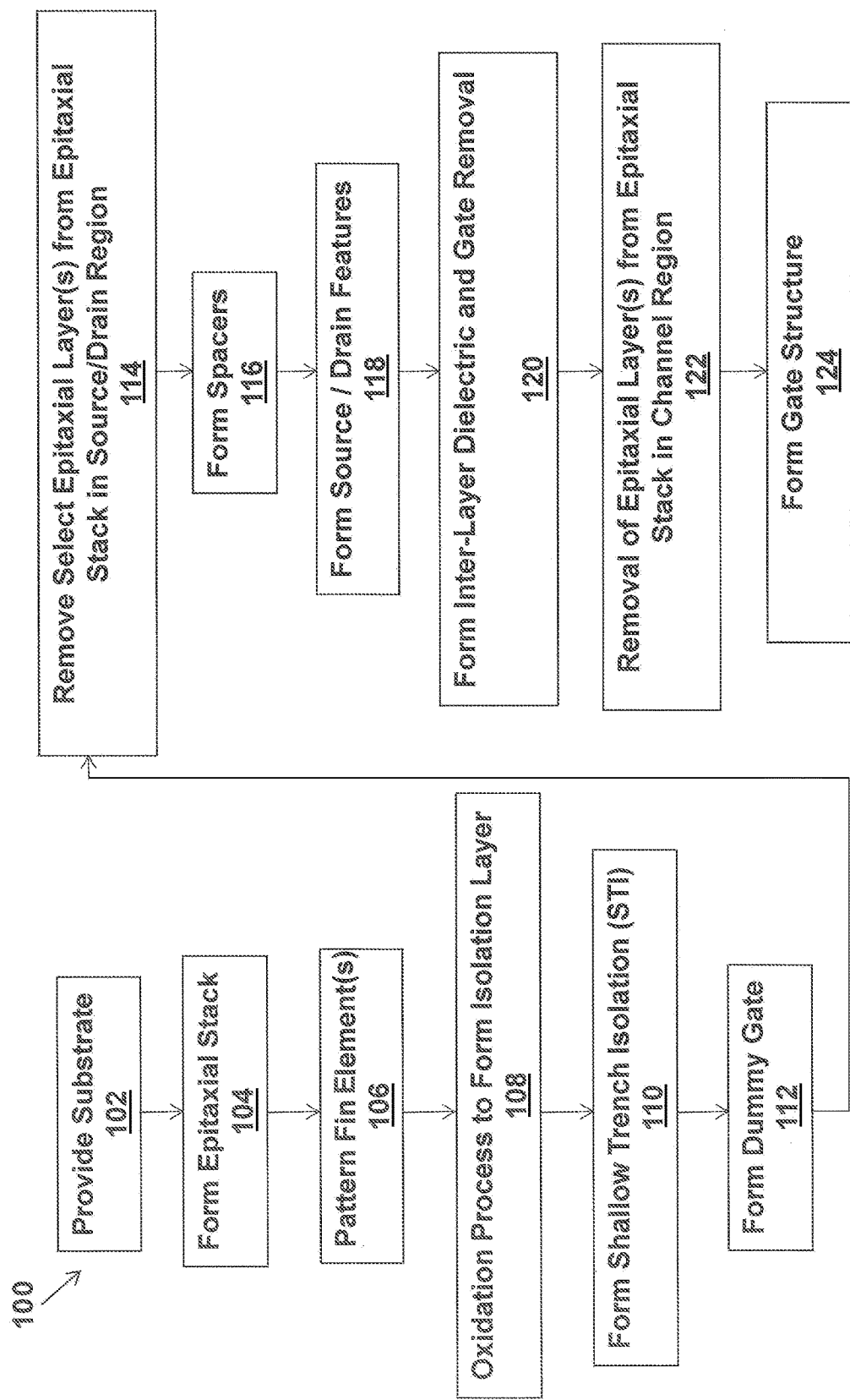
FIG. 1 is a flow chart of a method of fabricating a multi-gate device or portion provided according to one or more aspects of the present disclosure and including an isolation region under the gate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

Illustrated in FIG. 1 is a method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions.

FIGS. 2-11, 12A, and 13-16 are isometric views of an embodiment of a semiconductor device 200 according to various stages of the method 100 of FIG. 1. FIGS. 12B, 17, and 18 are cross-section views, corresponding to respective isometric views listed above, of an embodiment of the semiconductor device 200 according to various stages of the method 100 of FIG. 1. As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-19, as with the remainder of the method and exemplary figures provided in this disclosure, are merely exemplary and are not intended to be limiting beyond what is specifically recited in the claims that follow.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Figure 2:
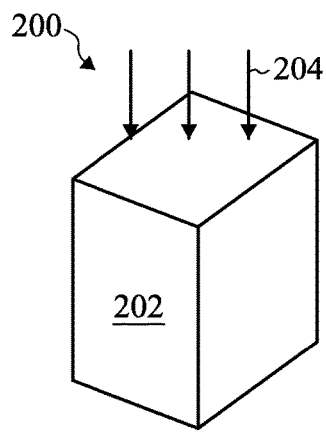
FIGS. 2, 3, 4, 5, 6, 7, 8, 9, 10, 11, 12A, 13, 14, 15, and 16 are isometric views of an embodiment of a device 200 according to aspects of the method of FIG. 1.

In an embodiment of the method 100, in block 102, an anti-punch through (APT) implant is performed. The APT implant may be performed in a region underlying the channel region of a device for example, to prevent punch-through or unwanted diffusion. In some embodiments, a first photolithography (photo) step is performed to pattern a P-type APT region and a second photo step is performed to pattern an N-type APT region. For example, in some embodiments, performing the first photo step may include forming a photoresist layer (resist) over the substrate 202, exposing the resist to a pattern (e.g., P-type APT implant mask), performing post-exposure bake processes, and developing the resist to form a patterned resist layer. By way of example, a P-type dopant implanted via the ion implantation process to form the P-type APT region may include boron, aluminum, gallium, indium, or other P-type acceptor material. Thereafter, in some embodiments, the second photo step may be performed, where the second photo step may include forming a resist layer over the substrate 202, exposing the resist to a pattern (e.g., N-type APT implant mask), performing post-exposure bake processes, and developing the resist to form a patterned resist layer. By way of example, an N-type dopant implanted via the ion implantation process into the N-type APT region may include arsenic, phosphorous, antimony, or other N-type donor material. Additionally, in various embodiments, an APT implant may have a high dopant concentration, for example, of between about $1\times10^{18}$ cm$^{-3}$ and $1\times10^{19}$ cm$^{-3}$. In some embodiments, such a high APT dopant concentration may be advantageously used, as described below, because of the presence of a subsequently formed isolation layer over the APT-implanted substrate, which can serve as a dopant diffusion barrier. The APT implant is illustrated in FIG. 2 as an implant 204.

Returning to FIG. 1, the method 100 then proceeds to block 104 where one or more epitaxial layers are grown on the substrate. With reference to the example of FIG. 3, in an embodiment of block 104, an epitaxial stack 302 is formed over the APT-implanted substrate 202. The epitaxial stack 302 includes epitaxial layers 304 of a first composition interposed by epitaxial layers 306 of a second composition. The first and second composition can be different. In an embodiment, the epitaxial layers 304 are SiGe and the epitaxial layers 306 are silicon. However, other embodiments are possible including those that provide for a first composition and a second composition having different oxidation rates. For example, in various embodiments, the epitaxial layer 304 has a first oxidation rate, and the epitaxial layer 306 has a second oxidation rate less than the first oxidation rate. In some embodiments, the epitaxial layer 304 includes SiGe and where the epitaxial layer 306 includes Si, the Si oxidation rate of the epitaxial layer 306 is less than the SiGe oxidation rate of the epitaxial layer 304. During a subsequent oxidation process, as discussed below, the portions the epitaxial layer 304 may be fully oxidized, while only the epitaxial layer 306 may be non-oxidized, or in some embodiments oxidized only slightly (e.g., sidewalls).

It is noted that the bottom-most epitaxial layer is denoted 304A for ease of reference in later process steps. In embodiments however, epitaxial layer 304A is substantially similar material to the epitaxial layers 304 formed over the epitaxial layer 304A. In an embodiment, the epitaxial layer 304A is SiGe and the epitaxial layers 304 may also be SiGe. In other embodiments, the epitaxial layer 304A has a different composition that epitaxial layers 304 and/or epitaxial layers 306. The thickness of the epitaxial layer 304A may be greater than that of the overlying epitaxial layers 304.

The epitaxial layers 306 or portions thereof may form a channel region of the multi-gate device 200. For example, the epitaxial layers 306 may be referred to as "nanowires" used to form a channel region of a multi-gate device 200 such as a GAA device. These "nanowires" are also used to form a portions of the source/drain features of the multi-gate device 200 as discussed below. Again, as the term is used herein, "nanowires" refers to semiconductor layers that are cylindrical in shape as well as other configurations such as, bar-shaped. The use of the epitaxial layers 306 to define a channel or channels of a device is further discussed below.

Figure 3:
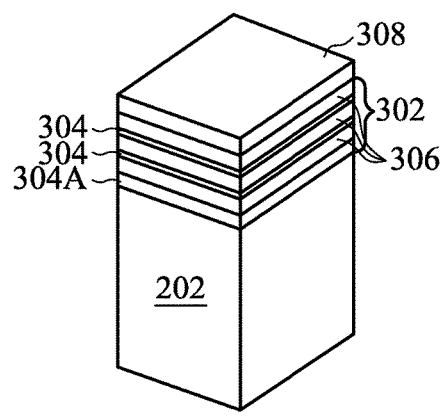
Figure 4:
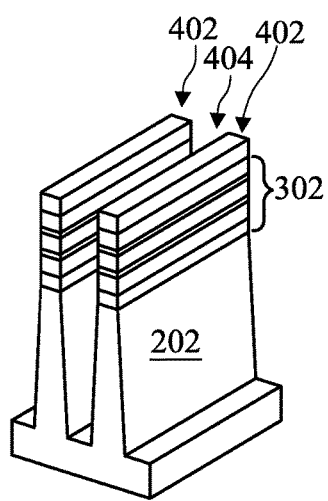
Figure 5:
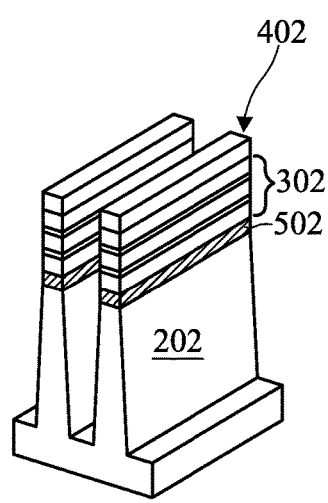

It is noted that three (3) layers of each of epitaxial layers 304 (including 304A) and 306 are illustrated in FIG. 3, this is for illustrative purposes only and not intended to be limiting beyond what is specifically recited in the claims. It can be appreciated that any number of epitaxial layers can be formed in the epitaxial stack 302; the number of layers depending on the desired number of channels regions for the device 200. In some embodiments, the number of epitaxial layers 306 is between 2 and 10.

In some embodiments, the epitaxial layer 304 has a thickness range of about 2-6 nanometers (nm). The epitaxial layers 304 (provided above the layer 304A) may be substantially uniform in thickness. In some embodiments, the epitaxial layer 304A has a thickness of approximately 8 to 15 nm. In some embodiments, the epitaxial layer 306 has a thickness range of about 6-12 nm. In some embodiments, the epitaxial layers 306 of the stack are substantially uniform in thickness. As described in more detail below, the epitaxial layer 306 may serve as channel region(s) for a subsequently-formed multi-gate device and its thickness chosen based on device performance considerations. The epitaxial layer 304 may serve to define a gap distance between adjacent channel region(s) for a subsequently-formed multi-gate device and its thickness chosen based on device performance considerations.

By way of example, epitaxial growth of the layers of the stack 302 may be performed by a molecular beam epitaxy (MBE) process, a metalorganic chemical vapor deposition (MOCVD) process, and/or other suitable epitaxial growth processes. In some embodiments, the epitaxially grown layers such as, the layers 306 include the same material as the substrate 202. In some embodiments, the epitaxially grown layers 304, 306 include a different material than the substrate 202. As stated above, in at least some examples, the epitaxial layer 304 includes an epitaxially grown silicon germanium (SiGe) layer and the epitaxial layer 306 includes an epitaxially grown silicon (Si) layer. In some embodiments, epitaxial layer 304A is also SiGe. Alternatively, in some embodiments, either of the epitaxial layers 304, 306 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 304, 306 may be chosen based on providing differing oxidation, etch selectivity properties. In various embodiments, the epitaxial layers 304, 306 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

As also shown in the example of FIG. 3, a hard mask (HM) layer 308 may be formed over the epitaxial stack 302. In some embodiments, the HM layer 308 includes an oxide layer (e.g., a pad oxide layer that may include $SiO_2$) and nitride layer (e.g., a pad nitride layer that may include $Si_3N_4$) formed over the oxide layer. In some examples, the HM layer 308 includes thermally grown oxide, CVD-deposited oxide, and/or ALD-deposited oxide. In some embodiments, the HM layer 308 includes a nitride layer deposited by CVD or other suitable technique. The HM layer 308 may be used to protect portions of the substrate 202 and/or epitaxial stack 302 and/or used to define a pattern (e.g., fin elements) illustrated below.

The method 100 then proceeds to block 106 where fin elements are patterned and formed. With reference to the example of FIG. 4, in an embodiment of block 106, a plurality of fin elements 402 extending from the substrate 202 are formed. In various embodiments, each of the fin elements 402 includes a substrate portion formed from the substrate 202, portions of each of the epitaxial layers of the epitaxial stack including epitaxial layers 304/304A and 306, and an HM layer portion from the HM layer 308.

The fins 402 may be fabricated using suitable processes including photolithography and etch processes. The photolithography process may include forming a photoresist layer over the substrate 202 (e.g., over the HM layer 308 of FIG. 3), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 404 in unprotected regions through the HM layer 306, through the epitaxial stack 302, and into the substrate 202, thereby leaving the plurality of extending fins 402. The trenches 404 may be etched using a dry etch (e.g., reactive ion etching), a wet etch, and/or other suitable processes.

Numerous other embodiments of methods to form the fins on the substrate may also be used including, for example, defining the fin region (e.g., by mask or isolation regions) and epitaxially growing the epitaxial stack 302 in the form of the fin 402. In some embodiments, forming the fins 402 may include a trim process to decrease the width of the fins 402. The trim process may include wet or dry etching processes.

The method 100 then proceeds to block 108 where an oxidation process is performed to form an isolation region within the fin element(s). With reference to the example of FIG. 5, in an embodiment of block 108, the device 200 is exposed to an oxidation process that fully oxidizes the epitaxial layer portion 304A of each of the plurality of fin elements 402. The epitaxial layer portion 304A is transformed into an oxidized layer 502, which provides an isolation region/layer. In some embodiments, the oxidized layer 502 has a thickness range of about 5 to about 25 nanometers (nm). In an embodiment, the oxidized layer 502 may include an oxide of silicon germanium (SiGeOx).

The oxidation process of block 108 may include forming and patterning various masking layers such that the oxidation is controlled to the epitaxial layer 304A. In other embodiments, the oxidation process is a selective oxidation due to the composition of epitaxial layer 304A. In some examples, the oxidation process may be performed by exposing the device 200 to a wet oxidation process, a dry oxidation process, or a combination thereof. In at least some embodiments, the device 200 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting.

As described above, in some embodiments, the first epitaxial layer portion 304A may include a material having a first oxidation rate, and the second epitaxial layer portion 306 may include a material having a second oxidation rate less than the first oxidation rate. By way of example, in embodiments where the first epitaxial layer portion 304A includes SiGe, and where the second epitaxial layer portion 306 includes Si, the faster SiGe oxidation rate (i.e., as compared to Si) ensures that the SiGe layer (i.e., the epitaxial layer portion 304A) becomes fully oxidized while minimizing or eliminating the oxidization of other epitaxial layers 304. It will be understood that any of the plurality of materials discussed above may be selected for each of the first and second epitaxial layer portions that provide different suitable oxidation rates.

The resultant oxidized layer 502 of each of the fin elements 402 can serve as a diffusion barrier to APT dopants previously implanted into the substrate 202, and which may be present in the substrate 202 directly below the oxidized layer 502. Thus, in various embodiments, the oxidized layer 502 serves to prevent APT dopants within the substrate portion 202 from diffusing for example, into the overlying epitaxial layer(s) 306, which can serve as a channel region for a subsequently formed multi-gate device. In other embodiments, the oxidized layer 502 is omitted.

The method 100 then proceeds to block 110 where shallow trench isolation (STI) features are formed between the fin elements. With reference to the example of FIG. 6, STI features 602 are disposed between the fins 402. By way of example, in some embodiments, a dielectric layer is first deposited over the substrate 202, filling the trenches 404 with the dielectric material. In some embodiments, the dielectric layer may include SiO₂, silicon nitride, silicon oxynitride, fluorine-doped silicate glass (FSG), a low-k dielectric, combinations thereof, and/or other suitable materials known in the art. In various examples, the dielectric layer may be deposited by a CVD process, a subatmospheric CVD (SACVD) process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer (and subsequently formed STI features 602) may include a multi-layer structure, for example, having one or more liner layers.

Figure 6:
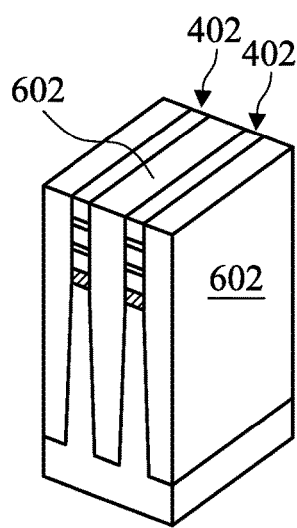

In forming the STI features, after deposition of the dielectric layer, the deposited dielectric material is thinned and planarized, for example by a chemical mechanical polishing (CMP) process. The CMP process may planarize the top surface thereby forming STI features 602. As illustrated in FIG. 6, in some embodiments, the CMP process used to planarize the top surface of the device 200 and form the STI features 602 may also serve to remove the HM layer 308 from each of the plurality of fin elements 402. In some embodiments, removal of the HM layer 308 may alternately be performed by using a suitable etching process (e.g., dry or wet etching).

Figure 7:
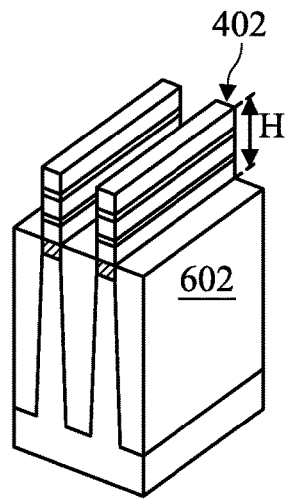

Continuing with block 110 of the method 100, the STI features interposing the fin elements are recessed. Referring to the example of FIG. 7, the STI features 602 are recessed providing the fins 402 extending above the STI features 602. In some embodiments, the recessing process may include a dry etching process, a wet etching process, and/or a combination thereof. In some embodiments, a recessing depth is controlled (e.g., by controlling an etching time) so as to result in a desired height 'H' of the exposed upper portion of the fin elements 402. The height 'H' exposes each of the layers of the epitaxy stack 302. While FIG. 7 illustrates the recess of the STI feature 602 being substantially coplanar with a top surface of the isolation region 502, in other embodiments this may not be required.

The method 100 then proceeds to block 112 where sacrificial layers/features are formed. In some embodiments, a dummy dielectric layer and/or a dummy gate structure is formed. For example, block 112 may include a dummy oxide deposition followed by a dummy gate structure. While the present discussion is directed to a replacement gate process whereby a dummy gate structure is formed and subsequently replaced, other configurations may be possible.

Figure 8:
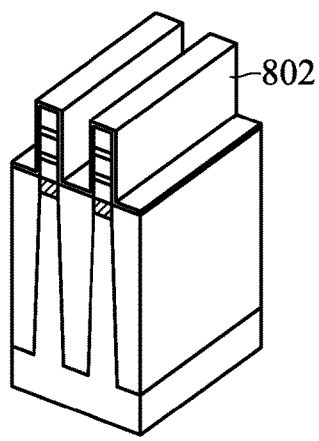

With reference to FIG. 8, a dielectric layer 802 is formed on the substrate 202. In some embodiments, the dielectric layer 802 may include SiO₂, silicon nitride, a high-K dielectric material or other suitable material. In various examples, the dielectric layer 802 may be deposited by a CVD process, a subatmospheric CVD (SACVD) process, a flowable CVD process, an ALD process, a PVD process, or other suitable process. By way of example, the dielectric layer 802 may be used to prevent damage to the fin elements 402 by subsequent processing (e.g., subsequent formation of the dummy gate stack). Additional dummy (e.g., sacrificial) layers including those comprising the dummy gate structure 902 of FIG. 9 may also be deposited as discussed below.

Figure 9:
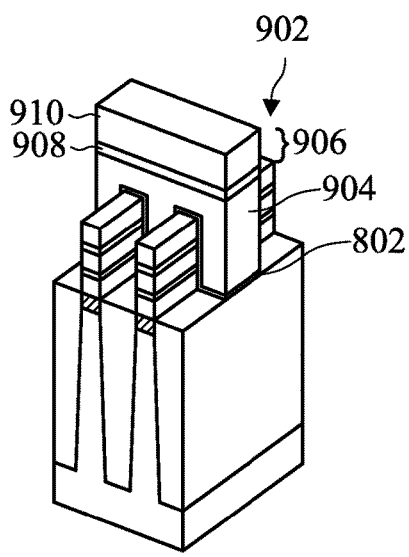

Referring now to the example of FIG. 9, in a further embodiment of block 112, fabrication and processing of the dummy gate stack is performed. Using the example of FIG. 9, a gate stack 902 is formed. In an embodiment, the gate stack 902 is a dummy (sacrificial) gate stack that is subsequently removed as discussed with reference to block 122 of the method 100. (However, as referenced above, in some embodiments of the method 100, the gate stack 902 or portions thereof may be maintained, for example, may be a high-K/metal gate stack. In such an embodiment, certain steps of the method 100 would be performed prior to the formation of the high-K metal gate stack such as step 122.)

Thus, in some embodiments using a gate-last process, the gate stack 902 is a dummy gate stack and will be replaced by the final gate stack at a subsequent processing stage of the device 200. In particular, the gate stack 902 may be replaced at a later processing stage by a high-K dielectric layer (HK) and metal gate electrode (MG) as discussed below. In some embodiments, the gate stack 902 is formed over the substrate 202 and is at least partially disposed over the fin elements 402. The portion of the fin elements 402 underlying the gate stack 902 may be referred to as the channel region. The gate stack 902 may also define a source/drain region of the fin elements 402, for example, the regions of the fin and epitaxial stack 302 adjacent and on opposing sides of the channel region.

In some embodiments, the gate stack 902 includes the dielectric layer 802, an electrode layer 904, and a hard mask 906 which may include multiple layers 908 and 910 (e.g., an oxide layer 908 and a nitride layer 910). In some embodiments, the dielectric layer 802 is not included in the gate stack 902, for example, being removed prior to the deposition of the gate stack 902. In some embodiments, an additional dummy gate dielectric layer is included in the gate stack in addition or in lieu of dielectric layer 802. In some embodiments, the gate stack 902 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the gate stack 902 may include an additional gate dielectric layer. For example, the gate stack 902 may include silicon oxide. Alternatively or additionally, the gate dielectric layer of the gate stack 902 may include silicon nitride, a high-K dielectric material or other suitable material. In some embodiments, the electrode layer 904 of the gate stack 902 may include polycrystalline silicon (polysilicon). In some embodiments, the hard mask layer 906 includes an oxide layer 908 such as a pad oxide layer that may include $SiO_2$. In some embodiments, hard mask layer 906 includes the nitride layer 910 such as a pad nitride layer that may include $Si_3N_4$, silicon oxynitride or alternatively include silicon carbide.

As illustrated in FIG. 9, in some embodiments, after formation of the dummy gate 902, the dielectric layer 802 is removed from the exposed regions of the substrate including fins 402 not covered by the gate 902.

Figure 10:
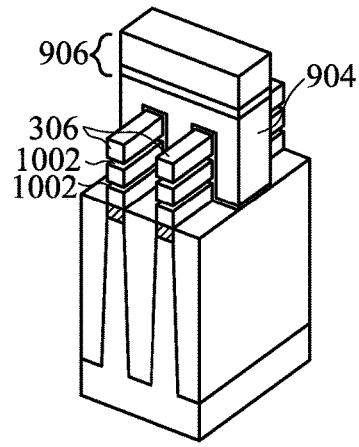
Figure 11:
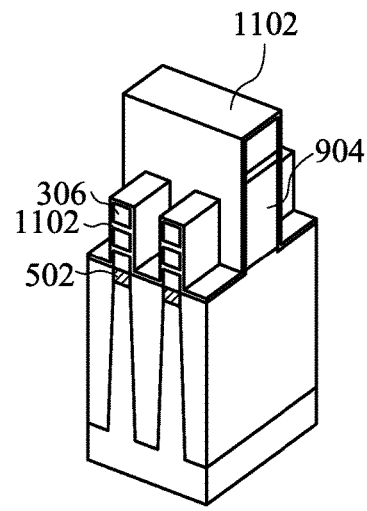

The method 100 then proceeds to block 114 where select epitaxial layers of the epitaxy stack are removed from the source/drain region of the fin element(s) (e.g., the region of the fin adjacent the channel region underlying the gate stack). As illustrated in FIG. 10, the epitaxial layers 304 have been removed from the substrate 202 in the source/drain region of the fins 402. FIG. 10 illustrates gaps 1002 in the place of the epitaxial layers 304 (FIG. 9). The gaps 1002 may be filled with the ambient environment (e.g., air, $N_2$). In an embodiment, the epitaxial layers 304 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx remove by an etchant such as $NH_4OH$. In an embodiment, the epitaxial layers 304 are SiGe and the epitaxial layers 306 are silicon allowing for the selective removal of the epitaxial layers 304.

The method 100 then proceeds to block 116 where a spacer layer is deposited on the substrate. The spacer layer may be a conformal dielectric layer formed on the substrate. The spacer layer may form spacer elements on the sidewalls of the gate structure. The spacer layer may also fill the gaps provided by the removal of the epitaxial layers described in block 114 above. Referring to FIG. 11, the spacer layer 1102 is disposed on the substrate 202 including filling the gaps (gaps 1002 of FIG. 10) between epitaxial layers in the source/drain region of the fin elements 402.

The spacer layer 1102 may include a dielectric material such as silicon oxide, silicon nitride, silicon carbide, silicon oxynitride, SiCN films, silicon oxycarbide, SiOCN films, and/or combinations thereof. In some embodiments, the spacer layer 1102 includes multiple layers, such as main spacer walls, liner layers, and the like. By way of example, the spacer layer 1102 may be formed by depositing a dielectric material over the gate stack 902 using processes such as, CVD process, a subatmospheric CVD (SACVD) process, a flowable CVD process, an ALD process, a PVD process, or other suitable process. In certain embodiments, the deposition may be followed by an etching back (e.g., anisotropically) the dielectric material. In some embodiments, prior to forming the sidewall spacers 1102, an ion implantation process may be performed to form lightly-doped drain (LDD) features within the semiconductor device 200.

Figure 12A:
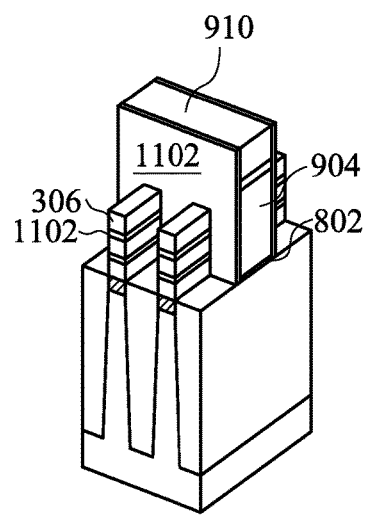
Figure 12B:
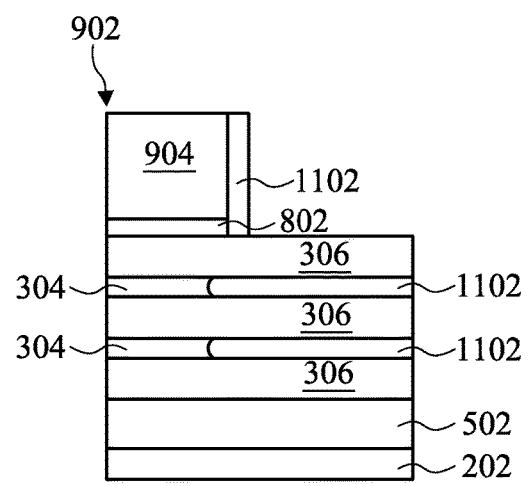
Figure 13:
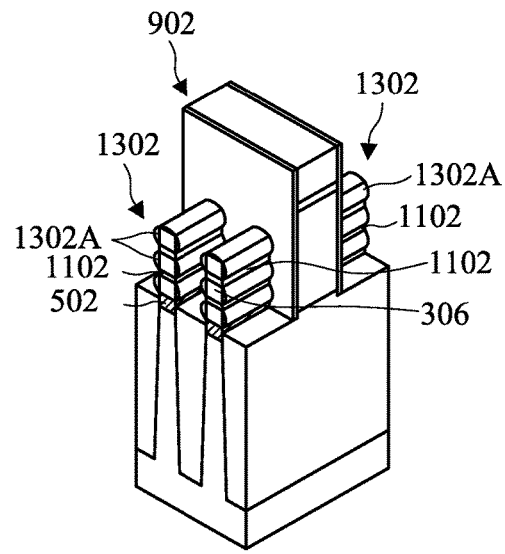
Figure 14:
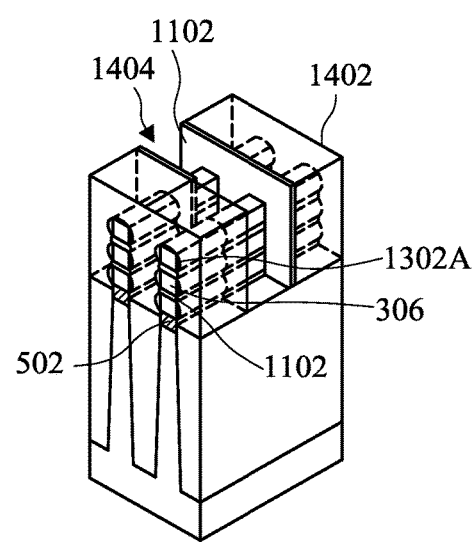
Figure 15:
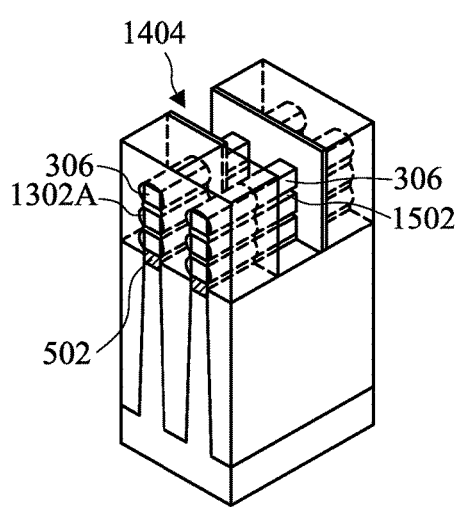

In some embodiments, with reference to the example of FIGS. 12A and 12B, after formation of the spacer layer 1102, the spacer layer 1102 may be etched-back to expose portions of the fin elements 402 adjacent to and not covered by the gate structure 902 (e.g., source/drain regions). The spacer layer material may remain on the sidewalls of the gate structure 902 forming spacer elements. In some embodiments, etching-back of the spacer layer 1102 may include a wet etch process, a dry etch process, a multiple-step etch process, and/or a combination thereof. While the spacer layer 1102 may be removed from a top surface of the exposed epitaxial stack 302 and the lateral surfaces of the exposed epitaxial stack 302, as illustrated in FIG. 12A/12B, the spacer layer 1102 remains interposing the epitaxial layers 306 of the epitaxial stack 302 in the source/drain region. FIG. 12B illustrates the partial cross-section corresponding to FIG. 12A. The spacer layer 1102 between the epitaxial layers 306 may be between approximately 2-6 nm in thickness.

The method 100 then proceeds to block 118 where source/drain features are formed. The source/drain features may be formed by performing an epitaxial growth process that provides an epitaxy material cladding the portions of the epitaxy layers remaining in the fins' source/drain regions. Referring to the example of FIG. 13, source/drain features 1302 are formed on the substrate 202 in/on the fin 402 adjacent to and associated with the gate stack 902. The source/drain features 1302 include material 1302A formed by epitaxially growing a semiconductor material on the exposed epitaxial layer 306. In other words, the material 1302A is formed around the nanowire (e.g., epitaxy layer 306) adjacent the gate; this may be referred to as forming a "cladding" around the nanowire.

In various embodiments, the grown semiconductor material 1302A may include Ge, Si, GaAs, AlGaAs, SiGe, GaAsP, SiP, or other suitable material. In some embodiments, the material 1302A may be in-situ doped during the epi process. For example, in some embodiments, epitaxially grown material 1302A may be doped with boron. In some embodiments, epitaxially grown material 1302A may be doped with carbon to form Si:C source/drain features, phosphorous to form Si:P source/drain features, or both carbon and phosphorous to form SiCP source/drain features. In an embodiment, the epitaxial layer 602 is silicon and the epitaxially grown material 1302A also is silicon. In some embodiments, the layers 602 and 1302A may comprise a similar material, but be differently doped. In other embodiments, the epitaxy layer 602 includes a first semiconductor material, the epitaxially grown material 1302A includes a second semiconductor different than the first semiconductor material.

In some embodiments, the epitaxially grown material 1302A is not in-situ doped, and, for example, instead an implantation process is performed to dope the epitaxially grown material 1302A. As described above, the isolation layer 502 which remains present beneath the gate stack 902, can block potential unwanted diffusion.

Thus, the source/drain features 1302 associated with the gate 902 include the epitaxy material 306 and/or the epitaxially grown material 1302A. It is noted that these features may be formed without recessing the fin 402. Dielectric material from the spacer layer 1102 interposes the epitaxy material 306. Each of the epitaxial material 306 (e.g., nanowires) extends into the channel region, thereby forming a multi-channel, multi-source/drain region device. The spacer layer 1102 between epitaxy layers 306 in the source/drain region may be approximately 2 to 6 nm in thickness.

The method 100 then proceeds to block 120 where an inter-layer dielectric (ILD) layer is formed. In certain embodiments, after forming the ILD layer the dummy gate stack is removed (as discussed below). Referring to the example of FIG. 14, in an embodiment of block 120, an ILD layer 1402 is formed over the substrate 202. In some embodiments, a contact etch stop layer (CESL) is also formed over the substrate 202 prior to forming the ILD layer 1402. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. A CESL layer 1702 is illustrated in FIG. 17. In some embodiments, the CESL layer 1702 is deposited after the epitaxially grown material 1302A and prior to the formation of the ILD layer 1402. In some embodiments, the ILD layer 1402 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1402 may be deposited by a PECVD process or other suitable deposition technique. In some embodiments, after formation of the ILD layer 1402, the semiconductor device 200 may be subject to a high thermal budget process to anneal the ILD layer. As described above, the insulating layer 502 can block some potential diffusion of APT dopants from within the substrate regions into the device channel region during such high thermal budget processing.

In some examples, after depositing the ILD (and/or CESL), a planarization process may be performed to expose a top surface of the gate stack 902. For example, a planarization process includes a chemical mechanical planarization (CMP) process which removes portions of the ILD layer 1402 (and CESL layer, if present) overlying the gate stack 902 and planarizes a top surface of the semiconductor device 200. In addition, the CMP process may remove the hard mask 906 overlying the gate stack 902 to expose the electrode layer 904, such as a polysilicon electrode layer. Thereafter, in some embodiments, the remaining previously formed gate stack 902 features (e.g., the dielectric layer 802 and the electrode layer 904) may be removed from the substrate. In some embodiments, the electrode layer 904 may be removed while the dielectric layer (e.g., 802) is not removed. The removal of the electrode layer 904 (or the electrode layer 904 and dielectric layer 802) from the gate stack 902 results in a trench 1404 illustrated in FIG. 14.

A final gate structure (e.g., including a high-K dielectric layer and metal gate electrode) may be subsequently formed in the trench 1404, as described below. The removal of the dummy gate stack features may be performed using a selective etch process such as a selective wet etch, a selective dry etch, or a combination thereof.

The method 100 then proceeds to block 122 where a selective removal of the epitaxial layer(s) in the channel region of the device is provided. In embodiments, the selected epitaxial layer(s) are removed in the of the fin elements within the trench provided by the removal of the dummy gate electrode (e.g., the region of the fin on and over which the gate structure will be formed, or the channel region). Referring to the example of FIG. 15, the epitaxy layers 304 are removed from the channel region of the substrate 202 and within the trench 1404. In some embodiments, the epitaxial layers 304 are removed by a selective wet etching process. In some embodiments, the selective wet etching includes HF. In an embodiment, the epitaxial layers 304 are SiGe and the epitaxial layers 306 are silicon allowing for the selective removal of the SiGe epitaxial layers 304. It is noted that during the interim processing stage of block 122 (e.g., FIG. 15), gaps 1502 are provided between the adjacent nanowires in the channel region (e.g., gaps 1502 between epitaxy layers 306). The gaps 1502 may be filled with the ambient environment conditions (e.g., air, nitrogen, etc).

It is noted that as illustrated in the accompanying figures the epitaxy layers 306 (e.g., nanowires) have a substantially rounded shape (e.g., cylindrical). The epitaxy layers 306 (e.g., nanowires) have a substantially bar-shaped shape in the source drain region. In some embodiments, this difference in the shape of the epitaxy layer 306 is due to the quantity and nature of the processing in each region. For example, in the channel region the dummy oxide removal and/or high-k dielectric deposition processes may provide for rounded shape. In some embodiments, the shape may be substantially similar in each region.

The method 100 then proceeds to block 124 where a gate structure is formed. The gate structure may be the gate of a multi-gate transistor. The final gate structure may be a high-K/metal gate stack, however other compositions are possible. In some embodiments, the gate structure forms the gate associated with the multi-channels provided by the plurality of nanowires (now having gaps there between) in the channel region.

Figure 16:
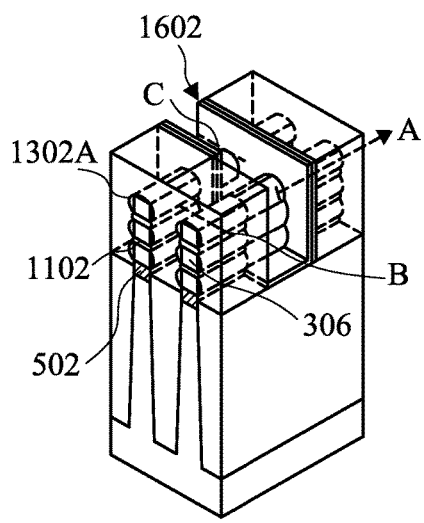

Referring to the example of FIG. 16, in an embodiment of block 124, a high-K/metal gate stack 1602 is formed within the trench 1404 of the device 200. In various embodiments, the high-K/metal gate stack 1602 includes an interfacial layer, a high-K gate dielectric layer 1604 formed over the interfacial layer, and/or a metal layer 1606 formed over the high-K gate dielectric layer 1604. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack may include depositions to form various gate materials, one or more liner layers, and one or more CMP processes to remove excessive gate materials and thereby planarize a top surface of the semiconductor device 200.

In some embodiments, the interfacial layer of the gate stack 1602 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer 1604 of the gate stack 1602 may include a high-K dielectric layer such as hafnium oxide ($HfO_2$). Alternatively, the gate dielectric layer 1604 of the gate stack 1602 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1604 may be formed by ALD, physical vapor deposition (PVD), CVD, oxidation, and/or other suitable methods. The gate dielectric layer 1604 of the gate stack 1602 is illustrated in FIGS. 16, 17, 18 and 19. The metal layer of the high-K/metal gate stack 1602 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer of gate stack 1602 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer of the gate stack 1602 may be formed by ALD, PVD, CVD, e-beam evaporation, or other suitable process. Further, the metal layer of the gate stack 1602 may be formed separately for N-FET and P-FET transistors which may use different metal layers. In various embodiments, a CMP process may be performed to remove excessive metal from the metal layer of the gate stack 1602, and thereby provide a substantially planar top surface of the metal layer of the gate stack 1602. The metal layer 1606 of the gate stack 1602 is illustrated in FIGS. 16, 17, and 18.

In addition, the metal layer may provide an N-type or P-type work function, may serve as a transistor (e.g., FINFET) gate electrode, and in at least some embodiments, the metal layer of the gate stack 1602 may include a polysilicon layer.

The device 200 may perform as a gate-all-around (GAA) device, the gate structure 1602 being formed on multiple sides of the nanowire (epitaxy layer 306). The multi-gate device 200 is illustrated in isometric view in FIG. 16 and corresponding cross-sectional views in FIG. 17 (cross-sectional cut A), FIG. 18 (cross-sectional cut C through the gate structure 1602), FIG. 19 (cross-sectional cut B through the source/drain). The ILD layer 1402 is removed for ease of reference in FIGS. 17, 18, and 18. As illustrated in FIGS. 17 and 18, the gate dielectric layer 1604 is disposed below the epitaxial layer 306 (e.g., nanowire). However, in other embodiments, other portions of the gate structure 1602 (e.g., gate electrode 1606) may also be disposed under the epitaxy layer 306. In some embodiments, the device 200 may be a FINFET device having a gate formed on at least two-sides of the channel region (e.g., top and two sidewalls) and/or have other configurations known in the art. The device 200 in FIG. 19 illustrates the source/drain feature 1302 having the epitaxially grown cladding layer 1302A disposed on multiple surfaces of the epitaxy layer 306 (e.g., nanowire), while dielectric 1102 is disposed between epitaxy layers 306.

The semiconductor device 200 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 20:
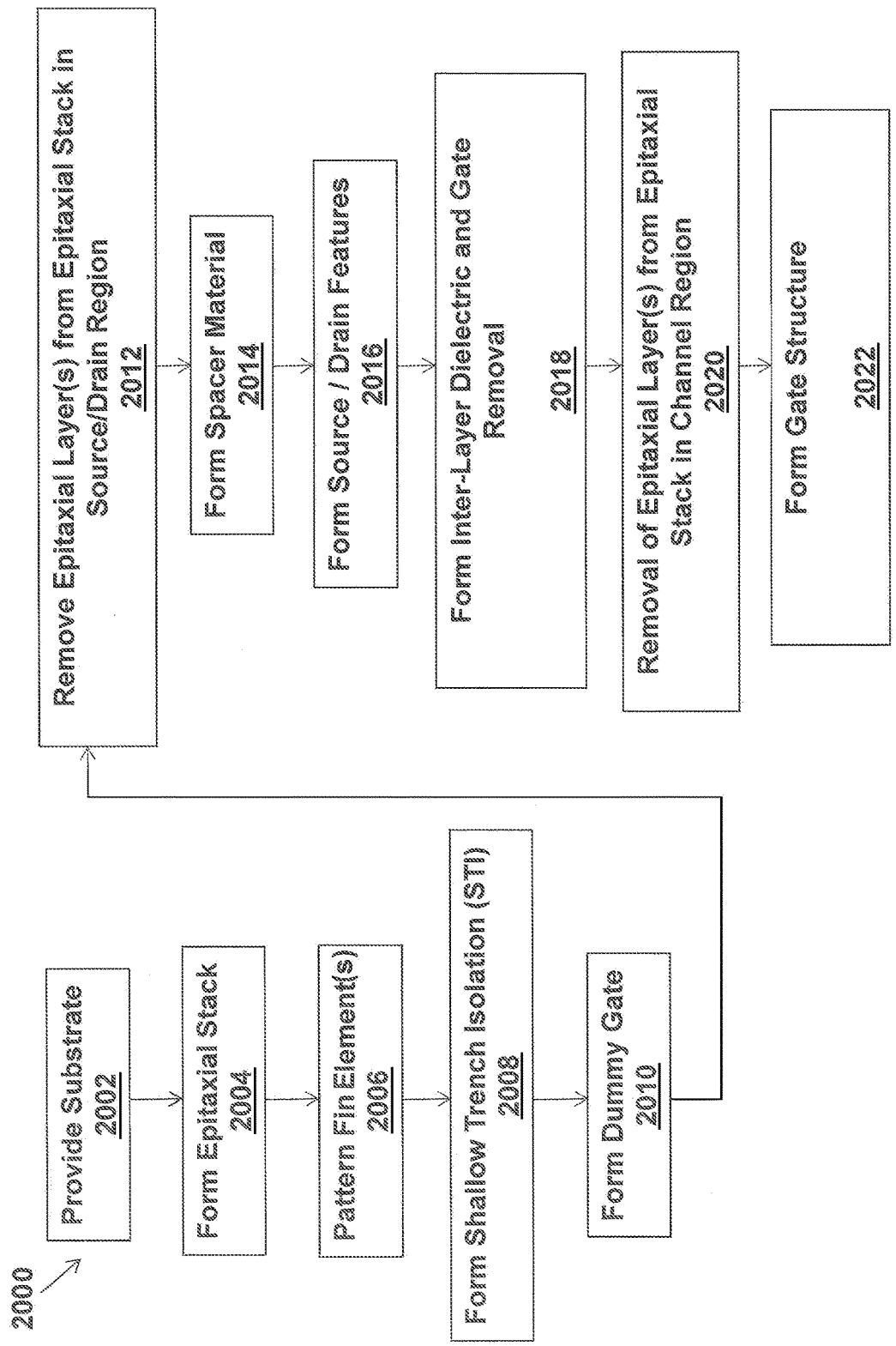
FIG. 20 is a flow chart of another method of fabricating a multi-gate device or portion thereof according to one or more aspects of the present disclosure.

Illustrated in FIG. 20 is a method 2000 of semiconductor fabrication including fabrication of multi-gate devices. The method 2000 may be substantially similar to the method 100 of FIG. 1, except with some differences highlighted below. However, the description of similar processes provide above with reference to the method 100 apply equally herein unless specifically noted otherwise.

FIGS. 21-29, 30A, and 31-34 are isometric views of an embodiment of a semiconductor device 2100 according to various stages of the method 2000 of FIG. 20. FIGS. 30B, 35, 36, and 37 are cross-section views, corresponding to respective isometric views listed above, of an embodiment of the semiconductor device 2100 according to various stages of the method 2000 of FIG. 20.

The method 2000 begins at block 2002 where a substrate is provided. Block 2002 may be substantially similar to block 102 of the method 100 described above. Referring to the example of FIG. 21, in an embodiment of block 102, a substrate 202 is provided. The substrate 202 may be substantially similar to as discussed above with reference to FIG. 2. Also as described above with reference to FIGS. 1 and 2, an APT implant 204 may be performed.

Returning to FIG. 20, the method 2000 then proceeds to block 2004 where one or more epitaxial layers are grown on the substrate. With reference to the example of FIG. 22, in an embodiment of block 2004, an epitaxial stack 2202 is formed over the APT-implanted substrate 202. The epitaxial stack 2202 includes epitaxial layers 304 of a first composition interposed by epitaxial layers 306 of a second composition. The first and second composition can be different. In an embodiment, the epitaxial layers 304 are SiGe and the epitaxial layers 306 are silicon. However, other embodiments are possible including those that provide for a first composition and a second composition having different oxidation rates and/or etch rates. In various embodiments, the epitaxial layer 304 has a first oxidation rate, and the epitaxial layer 306 has a second oxidation rate less than the first oxidation rate. For example, in some embodiments, the epitaxial layer 304 is SiGe and the epitaxial layer 306 is Si, the Si oxidation rate being is less than the SiGe oxidation rate. During a subsequent oxidation process, as discussed below, the portions the epitaxial layer 304 may be fully oxidized, while only the epitaxial layer 306 may be non-oxidized, or in some embodiments oxidized only slightly (e.g., sidewalls).

Thus, the epitaxial stack 2202 (and epitaxial layers 304, 306) is similar to that described above with reference to block 104 of the method 100 and epitaxial stack 302 of FIG. 3, except that the epitaxial stack 2202 does not include an epitaxial layer that is subsequently formed into an isolation region (compare epitaxial layer 304A). As such, each layer 304 of the epitaxial stack 2202 may be substantially the same thickness (e.g., within 10%). In an embodiment, each epitaxial layer 304 of the epitaxial stack 2202 has a thickness of about 2-6 nm. In an embodiment, each epitaxial layer 306 of the epitaxial stack 2202 has a thickness of about 6 to 12 nm. As described in more detail below, the epitaxial layer 306 may serve as channel region(s) for a subsequently-formed multi-gate device and its thickness chosen based on device performance considerations. The epitaxial layer 304 may serve to define a gap distance between adjacent channel region(s) for a subsequently-formed multi-gate device and its thickness chosen based on device performance considerations.

It is noted that three (3) layers of each of epitaxial layers 304 and 306 in the epitaxial stack 2202 are illustrated in FIG. 22, this is for illustrative purposes only and not intended to be limiting beyond what is specifically recited in the claims. It can be appreciated that any number of epitaxial layers can be formed in the epitaxial stack 2202; the number of layers depending on the desired number of channels of for the device 2100. In some embodiments, the number of epitaxial layers 306 is between 2 and 10. As also shown in the example of FIG. 22, a hard mask (HM) layer 308 may be formed over the epitaxial stack 2202, substantially similar to as discussed above with reference to the HM layer 308 of FIG. 3.

The method 2000 then proceeds to block 2006 where fin elements are formed. With reference to the example of FIG. 23, in an embodiment of block 2006, a plurality of fin elements 402 extending from the substrate 202 are formed. In various embodiments, each of the fin elements 402 includes a substrate portion formed from the substrate 202, portions of each of the epitaxial layers of the epitaxial stack 302 including epitaxial layers 304 and 306, and an HM layer portion from the HM layer 308. The fin elements 402 may be formed substantially similar to as discussed above with reference to block 106 of the method 100 and/or FIG. 4.

The method 2000 then proceeds to block 2008 where shallow trench isolation (STI) features are formed between the fin elements. With reference to the example of FIGS. 24 and 25, STI features 602 are disposed between the fins 402 and subsequently recessed. The STI features 602 may be substantially similar to as discussed above with reference to block 110 of the method 100 and/or the example of FIGS. 6 and 7. Referring to the example of FIG. 25, the STI features 602 are recessed providing the fins 402 extending above the STI features 602. In some embodiments, the recessing process may include a dry etching process, a wet etching process, and/or a combination thereof. In some embodiments, a recessing depth is controlled (e.g., by controlling an etching time) so as to result in a desired height 'H' of the exposed upper portion of the fin elements 402. The height 'H' exposes layers of the epitaxy stack 302.

The method 2000 then proceeds to block 2010 where sacrificial layers including a dummy gate structure are formed. Block 2010 may be substantially similar to block 112 of the method 100. With reference to FIG. 26 and FIG. 27, a dielectric layer 802 and a gate structure 902 (e.g., dummy gate structure) are formed on the device 2100. The dielectric layer 802 and/or the gate structure 902 may be substantially similar to as discussed above including with reference to block 112 and FIGS. 8 and 9.

The method 2000 then proceeds to block 2012 where select epitaxial layers of the epitaxy stack are removed from the fin region adjacent the gate stack, also referred to as the source/drain region of the fin as it is the portion of the fin that will later be formed into the source/drain feature associated with the multi-gate device 2100. As illustrated in FIG. 28, the epitaxial layers 304 have been removed from the substrate 202 in the source/drain region of the fins 402 providing gaps 1002 in the place of the epitaxial layers 304 (FIG. 27). The gaps 1002 may be filled with the ambient environment (e.g., air, $N_2$). Block 2012 and the gaps 1002 may be substantially similar to block 114 and gaps 1002 described above with reference to FIGS. 1 and 10 respectively.

Figure 29:
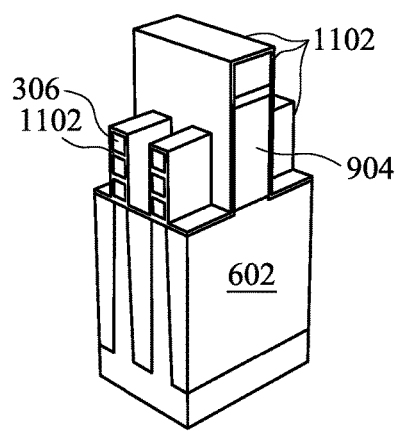
Figure 30A:
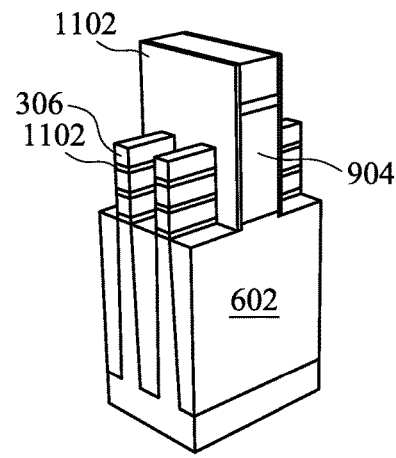
Figure 30B:
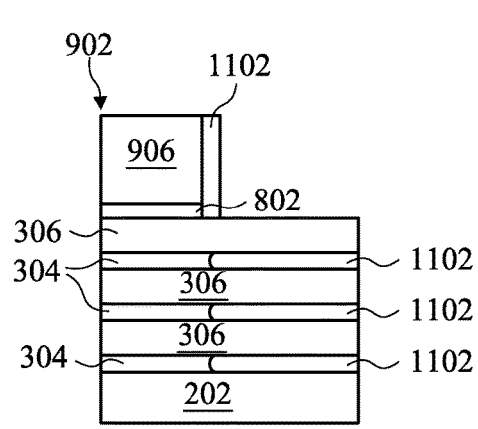
Figure 31:
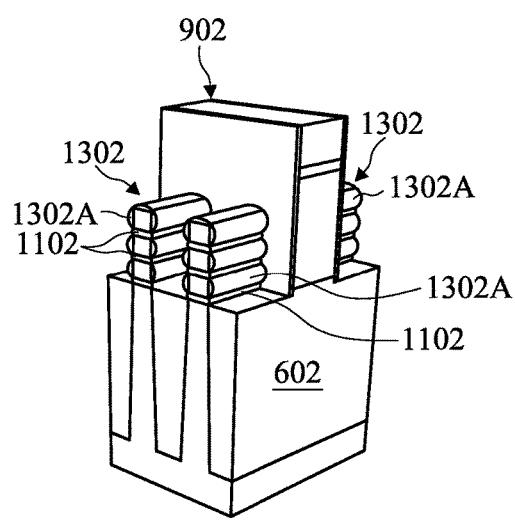

The method 2000 then proceeds to block 2014 where a spacer layer is deposited on the substrate. Block 2014 may be substantially similar to block 116 of the method 100, described above with reference to FIGS. 1 and 11. The spacer layer may be any dielectric layer including dielectric materials including silicon as discussed above. Exemplary FIG. 29 illustrates the spacer layer 1102 disposed on the fins 402 including filling in the gaps 1002. In some embodiments, with reference to the example of FIGS. 30A and 30B, after formation of the spacer layer 1102, the spacer layer 1102 may be etched-back to expose portions of the fin elements 402 adjacent to and not covered by the gate structure 902 (e.g., source/drain regions). Exemplary FIGS. 30A and 30B may be substantially similar to as discussed above with reference to FIGS. 12A and 12B. As discussed above, while the spacer layer 1102 may be removed from a top surface of the epitaxial stack 2202 and the lateral surfaces of the epitaxial stack 2202, as illustrated in FIG. 30A/30B, the spacer layer 1102 remains interposing the epitaxial layers 306 of the epitaxial stack 302 in the source/drain region. FIG. 30B illustrates the partial cross-section corresponding to FIG. 30A. The spacer layer 1102 between the epitaxial layers 306 may be between approximately 2-6 nm in thickness. In addition, as illustrated in FIG. 30A, after the spacer layer 1102 is etched-back the STI features 602 may be slightly recessed further such that a top surface of the STI features 602 is below, or substantially aligned with a bottom surface of, the bottommost epitaxial layer 304 (e.g., the bottommost SiGe layer).

The method 2000 then proceeds to block 2016 where source/drain features are formed. Block 2016 may be substantially similar to block 118 of the method 100, described above with reference to FIG. 1. As discussed above, the source/drain features may be formed by performing an epitaxial growth process that provides an epitaxy material cladding the exposed portions of the epitaxy layers in the fins' source/drain regions. For example, the epitaxy material may be cladding the epitaxy layers or nanowires of the source/drain region except where the dielectric spacer material is disposed between the epitaxy layers (or nanowires). Referring to the example of FIG. 31, source/drain features 1302 are formed on the substrate 202 on the fin 402 adjacent the gate stack 902. The source/drain features 1302 include material 1302A formed by epitaxially growing a semiconductor material layer on the region of the epitaxial layer 306 adjacent the gate structure 902. In other words, the material 1302A is formed around the nanowire (e.g., epitaxy layer 306) adjacent the gate; this may be referred to as forming a "cladding" around the nanowire. The source/drain features 1302 including epitaxial material 1302A may be substantially similar to as discussed above with reference to FIG. 13.

Figure 32:
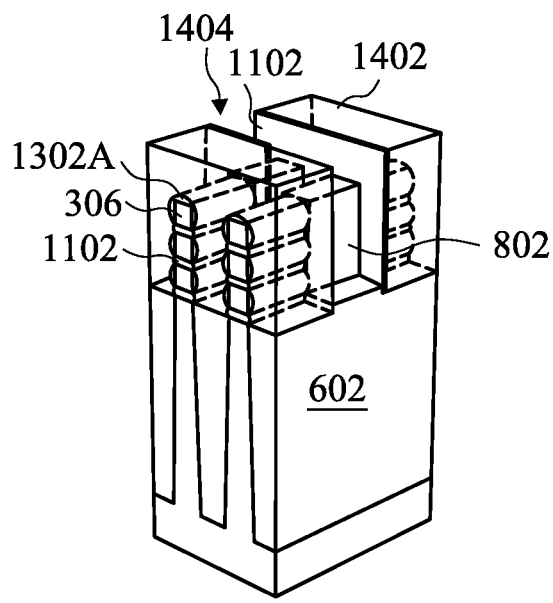
Figure 33:
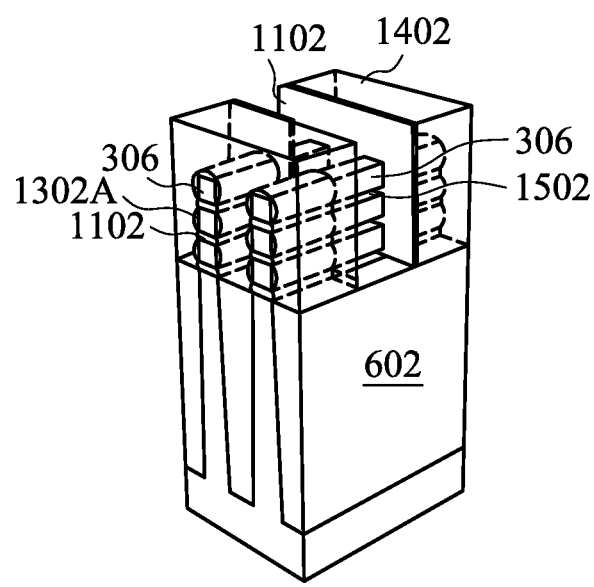
Figure 34:
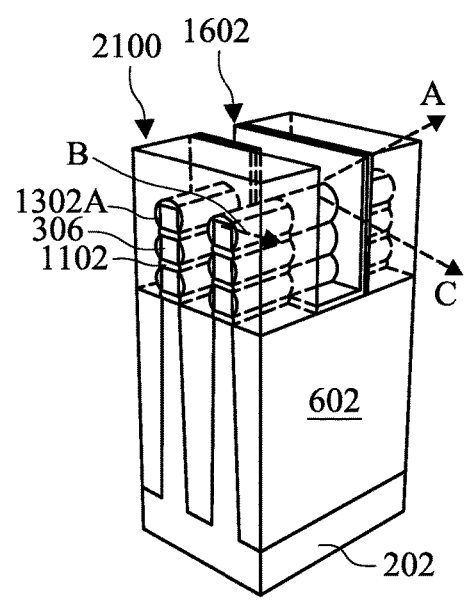

The method 2000 then proceeds to block 2018 where an inter-layer dielectric (ILD) layer is formed. In some embodiments, a CESL layer may also be formed. In some embodiments, the gate structure may subsequently be removed from the substrate. Block 2018 may be substantially similar to block 120 of the method 100, discussed above with reference to FIG. 1 and the example of FIG. 14. Referring to the example of FIG. 32, an ILD layer 1402 is formed over the substrate 202. As illustrated in FIG. 32, the removal of the electrode layer 904 (or the electrode layer 904 and dielectric layer 802) from the gate stack 902 results in a trench 1404. While FIG. 32 illustrates an interim process wherein the dielectric layer 802 is disposed in the trench 1404, in other embodiments, the dielectric layer 802 is also removed.

The method 2000 then proceeds to block 2020 where a selective removal of the epitaxial layer(s) in the channel region of the device is provided. In embodiments, the selected epitaxial layer(s) are removed in the region of the fin on and over which the gate structure will be formed. Block 2020 may be substantially similar to block 122 of the method 100 of FIG. 1 and/or the example of FIG. 15. Referring to the example of FIG. 33, the epitaxy layers 304 are removed from the channel region of the substrate 202 within the trench 1404. As discussed above, in an embodiment, the epitaxial layers 304 are SiGe and the epitaxial layers 306 are silicon allowing for the selective removal of the SiGe epitaxial layers 304. It is noted that during block 2020 (e.g., FIG. 33), gaps 1502 are provided between the adjacent nanowires in the channel region (e.g., gaps 1502 between epitaxy layers 306).

The method 2000 then proceeds to block 2022 where a gate structure is formed. Block 2022 may be substantially similar to block 124 of the method 100, described above with reference to FIG. 1 and/or the examples of 16, 17, 18, and 19. Referring to the example of FIG. 34, in an embodiment of block 2022, a high-K/metal gate stack 1602 is formed within the trench 1404 of the device 2100. The gate stack 1602 may be substantially similar to as discussed above.

Thus, the device 2100 may perform as a multi-gate device including a gate-all-around (GAA) device, the gate structure 1602 being formed on multiple sides of the nanowire (epitaxy layer 304). The multi-gate device 2100 is illustrated in isometric view in FIG. 34 and corresponding cross-sectional views in FIG. 35 (cross-sectional cut A), FIG. 36 (cross-sectional cut C through the gate structure 1602), FIG. 37 (cross-sectional cut B through the source/drain). The ILD layer 1402 is removed for ease of reference in FIGS. 35, 36, and 37. As illustrated in FIGS. 35 and 36, the gate dielectric layer 1604 is disposed below the epitaxial layer 306 (e.g., nanowire) in the channel region. However, in other embodiments, other portions of the gate structure 1602 (e.g., gate electrode 1606) may also be disposed under the epitaxy layer 306. In some embodiments, the device 2100 may be a FINFET device having a gate formed on at least two-sides of the channel region (e.g., top and two sidewalls) and/or have other configurations known in the art.

The device 2100 differs from the device 200, for example, in the omission of an isolation region (see isolation layer 502) present in device 200. This may provide advantages in production steps and timing. In some embodiments, the performance considerations of the multi-gate device do not necessitate isolation layers. Also as described above with reference to the method 100 and the exemplary device 200 further processing may be performed with reference to the method 2000 and the device 2100.

Figure 38:
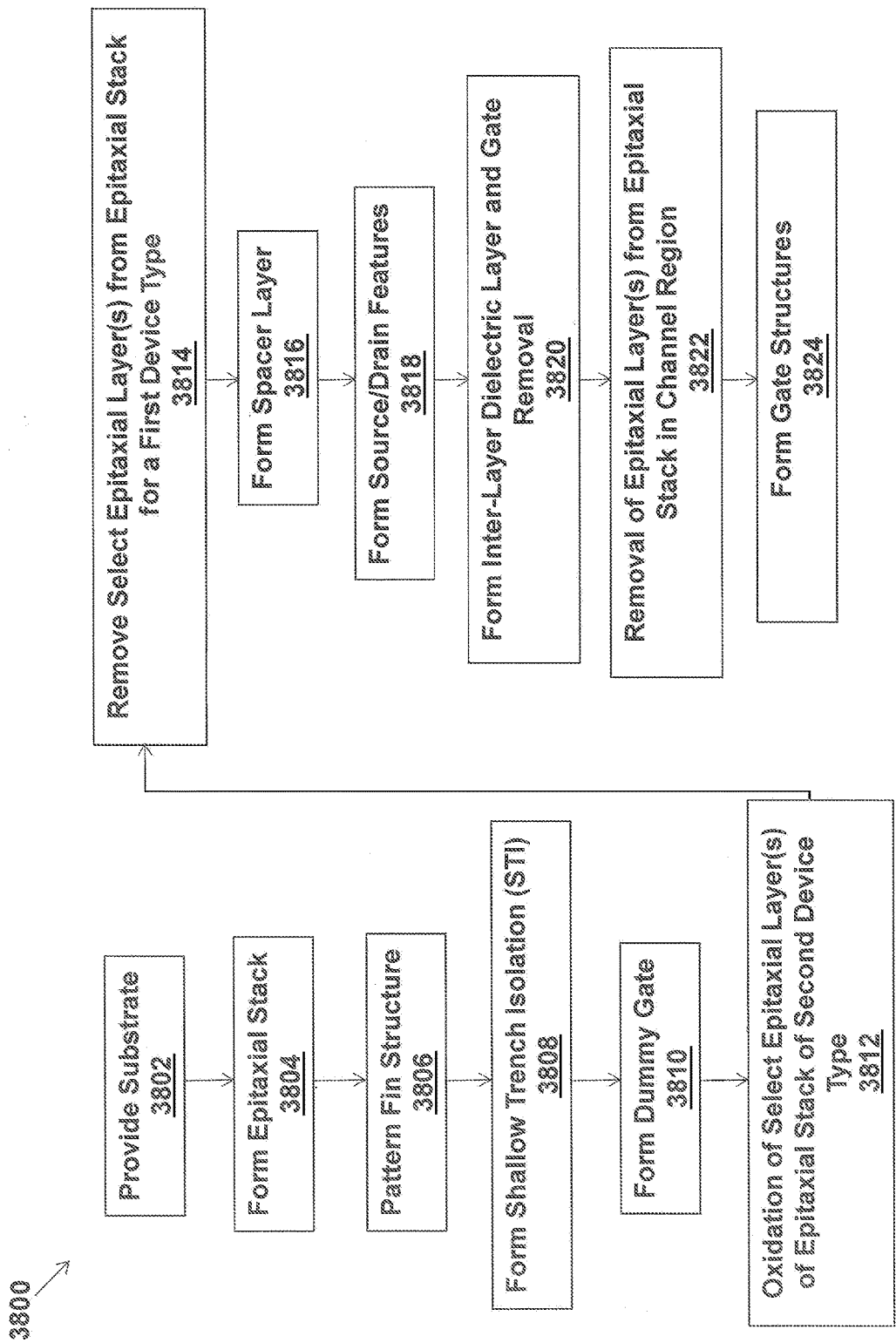
FIG. 38 is a flow chart of a method of fabricating each n-type and p-type multi-gate devices or portion thereof according to one or more aspects of the present disclosure.

Illustrated in FIG. 38 is a method 3800 of semiconductor fabrication including fabrication of multi-gate devices. The method 3800 may be substantially similar to many aspects of the method 100 of FIG. 1 and/or the method 2000 of FIG. 20, except with some differences highlighted below. Thus, the description of similar processes provided above with reference to the method 100 and/or the method 2000 apply equally herein unless noted otherwise. FIG. 38 also illustrates concurrent stages of fabrication of both types of devices, n-type and p-type transistors, which may be formed on the same substrate.

FIGS. 21, 22, 23, 24, 25, 26, and 27 are isometric views of an embodiment of the semiconductor device 2100 that also apply to various stages of the method 3800. (These figures can be applied to processing of both types of devices concurrently and/or substantially similarly.) Following the stage illustrated in FIG. 27, FIGS. 39A, 39B, 40A, 40B, 41A, 41B, 42A, 42B, 43A, 43B, 44A, 44B, 45A, 45B, 46A, 46B, 47A, and 47B, corresponds to various stages of the method 3800 of FIG. 38. FIGS. 48A, 48B, 49A, 49B, 50A, and 50B are cross-section views, corresponding to respective isometric views listed above. It is noted that the FIG. designated "A" (e.g., FIG. 39A represents a first type of device (e.g., p-type field effect transistor) and the FIG. designated "B" represents a second type of device (e.g., n-type FET) at the corresponding stage. Each device type, e.g., that represented by the "A" figure and that represented by the "B" figure may be formed on the same substrate (e.g., substrate 202). One or more isolation features (e.g., STI) may interpose the devices of a first type from those of a second type.

The method 3800 begins at block 3802 where a substrate is provided. Block 3802 may be substantially similar to block 2002 of the method 2000 described above with reference to FIG. 20 and FIG. 21, which are exemplary of providing the substrate 202. The method 3800 then proceeds to block 3804 where one or more epitaxial layers are grown on the substrate. Block 3802 may be substantially similar to block 2004 of the method 2000, described above with reference to FIG. 20. FIG. 22 is exemplary of an epitaxial stack 2202 and HM layer 308 is formed over the substrate 202.

The method 3800 then proceeds to block 3806 where fin elements are formed. Block 3806 may be substantially similar to block 2006 of the method 2000, described above with reference to FIG. 20. FIG. 23 is likewise exemplary of a plurality of fin elements 402 extending from the substrate 202. The method 3800 then proceeds to block 3808 where shallow trench isolation (STI) features are formed between the fin elements. Block 3808 may be substantially similar to block 2008 of the method 2000, described above with reference to FIG. 20. FIGS. 24 and 25 are likewise exemplary of STI features 602 disposed between the fins 402 and subsequently recessed.

The method 3800 then proceeds to block 3810 where sacrificial or dummy layers including a dummy gate structure are formed on the substrate. In an embodiment, a dummy dielectric (e.g., oxide) and a dummy gate structure are formed on the fins. Block 3810 may be substantially similar to block 2020 of the method 2000. FIG. 26 and FIG.

27 are illustrative and include forming a dielectric layer 802 and a gate structure 902 (e.g., dummy gate structure).

The method 3800 then proceeds to block 3812 where select epitaxial layers of the epitaxy stack on device(s) of a second type are oxidized, while the fins of the device(s) of a first type are protected by a masking layer. In an embodiment, the fins or fin regions corresponding to a PFET are covered by the masking layer such as a hard mask. In some embodiments, the masking layer includes a hard mask having an oxide layer (e.g., a pad oxide layer that may include $SiO_2$) and/or nitride layer (e.g., a pad nitride layer that may include $Si_3N_4$). In some examples, the masking layer includes thermally grown oxide, CVD-deposited oxide, and/or ALD-deposited oxide. In some embodiments, the masking layer includes a nitride layer deposited by CVD or other suitable technique.

While the fins of the device(s) of a first type are protected, an oxidation process is performed such that select epitaxial layers of the fins of the device(s) of the second type are oxidized. In some embodiments, the SiGe epitaxial layers of the epitaxial stack of the second type of devices are oxidized (e.g., fully oxidized). The substrate including the devices of each of the first and second types can be subjected to a wet oxidation process, a dry oxidation process, or a combination thereof. In at least some embodiments, the device(s) are exposed to a wet oxidation process using water vapor or steam as the oxidant.

Referring to the example of FIG. 39A of block 3812, a device of a first type (e.g., PFET) has a hard mask layer 3902 disposed thereon. While the HM layer 3902 is disposed on the device of the first type, an oxidation process is performed on the epitaxial layers 304 of the source/drain region of the fins of the device(s) of the second type (e.g., NFET) as illustrated in FIG. 39B. The oxidation process provides oxidized layers 3904. In some embodiments, the materials of the epitaxial layers 304, 306 have different oxidation rates allowing for a selective oxidation process. For example, in some embodiments, the epitaxial layers 304 are SiGe and the epitaxial layers 306 are Si. The SiGe can oxidize at a much higher rate than the Si. Again using FIG. 39A as an example, in an embodiment, the epitaxial layers 304 are SiGe and result in an oxidized layer 3904 of SiGeOx. In some embodiments, the epitaxial layers 306 are not oxidized.

In some embodiments, the epitaxial layers 304 are fully oxidized to form the oxidized layer 3904. In some embodiments, the thickness of the epitaxial layer 304 in the source/drain region is between approximately 2 and 6 nm, for example, as illustrated in FIGS. 22-27. Upon oxidation of the epitaxial layer 304, the layer may expand to provide a thickness of the oxidized layer 3904, for example, in some embodiments, the oxidized layer 3904 has a thickness between approximately 5 and 25 nanometers. This expansion can provide for a stress (e.g., resulting in a bending of adjacent layers), which is applied to the epitaxial layers 306 of the source drain region of the fins 402. This is illustrated in cross-sectional illustration in FIG. 48B. In FIG. 48B, because of the increase in thickness of the oxidized layer 3904, the epitaxial layers 306 are no longer coplanar or collinear between the channel region (under the gate) and the source/drain region. It is noted that the epitaxial layers 306 remain a substantially consistent thickness between the source/drain region and the channel region (e.g., between 6 and 12 nanometers). This can provide for a strain enhancement of the device which may be beneficial, for example, for NMOS devices. As discussed above, in some embodiments, the second device type (illustrated by figures "B") is an NFET.

In some embodiments, block 3810 continues to provide for the removal of the hard mask layer on the first device type. Using the example of FIGS. 40A/40B, the hard mask layer 3902 is removed from the substrate 202.

The method 3800 then proceeds to block 3814 where select epitaxial layers of the epitaxy stack are removed from the fin element source/drain region in the fins of the device(s) of a first type (e.g., PFET). As illustrated in FIG. 41A/41B, the epitaxial layers 304 have been removed in the source/drain region of the fins 402 for the first device type (FIG. 41A). The second device type (FIG. 41B) remains substantially unchanged. As the exposed epitaxial layer 304 in the second device type has been oxidized to form oxidized layers 3904, an etch may be selective to the epitaxial layer 304 causing its removal in the first device type. In other embodiments, appropriate patterning and masking steps are performed. FIG. 41A illustrates gaps 1002 in the place of the removed epitaxial layers 304 (FIG. 40A). The gaps 1002 may be filled with the ambient environment (e.g., air, $N_2$). Block 3814 and the gaps 1002 may be substantially similar to block 114 and gaps 1002 described above with reference to FIGS. 1 and 10 respectively.

The method 3800 then proceeds to block 3816 where a spacer layer is deposited on the substrate over the fins of both device types. FIGS. 42A/42B illustrate a spacer layer 1102 disposed on the fins 402. With respect to devices of the first type, FIG. 42A illustrates the spacer layer 1102 is formed on the fins including in the gaps 1002. Block 3816 may be substantially similar to block 116 of the method 100, described above with reference to FIGS. 1 and 11, and/or block 2014 of the method 2000 described above with reference to FIG. 20. In some embodiments, with reference to the example of FIGS. 43A/43B, after formation of the spacer layer 1102, the spacer layer 1102 may be etched-back to expose portions of the fin elements 402 adjacent to and not covered by the gate structure 902 (e.g., source/drain regions). The example of FIG. 43A may be substantially similar to as discussed above with reference to FIGS. 12A and 12B. As discussed above, while the spacer layer 1102 may be removed from a top surface of the epitaxial stack 2202 and the lateral surfaces of the epitaxial stack 2202, as illustrated in FIG. 43A, the spacer layer 1102 remains interposing the epitaxial layers 306 of the epitaxial stack 302 in the source/drain region of the first type of device. The spacer layer 1102 between the epitaxial layers 306 in the fin elements 402 of the device(s) of the first type may be between approximately 2-6 nm in thickness. Meanwhile with reference to devices of the second type, FIG. 43B is illustrative of the spacer layer 1102 being etched-back such that it remains on the sidewalls of the gate structure 902 forming spacer elements.

The method 3800 then proceeds to block 3818 where source/drain features are formed in the source/drain regions of each device type. Block 3818 may be substantially similar to block 2016 of the method 2000, described above with reference to FIGS. 20 and 31, and/or may be substantially similar to block 118 of the method 100, described above with reference to FIGS. 1 and 13. As discussed above, the source/drain features may be formed by performing an epitaxial growth process that provides an epitaxy material cladding the portions of the epitaxy layers in the fins' source/drain regions. The epitaxial material grown in block 3818 may be the same or different than the epitaxial material of the layer on which it is grown (e.g., epitaxial layer 306). Referring to the example of FIG. 44A/44B, source/drain features 4402 and 4404 are formed on the fin elements 402 adjacent the gate stack 902 for each device type.

Referring to example FIG. 44A, the source/drain features 4402 include material 4402A formed by epitaxially growing a semiconductor material layer on the region of the epitaxial layer 306 adjacent the gate structure 902. In other words, the material 4402A is formed around the nanowire (e.g., epitaxy layer 306) adjacent the gate; this may be referred to as forming a "cladding" around the nanowire. The source/drain features including epitaxial material 4402A may be substantially similar to the epitaxial source/drain material 1302A as discussed above with reference to FIG. 13. The epitaxial material 4402A may be suitably doped to provide a source/drain feature for a first device type (e.g., PFET).

Referring to the example of FIG. 44B, the source/drain features 4404 include material 4404A formed by epitaxially growing a semiconductor material layer on the region of the epitaxial layer 306 adjacent the gate structure 902. In other words, the material 4404A is formed around the nanowire (e.g., epitaxy layer 306) adjacent the gate; this may be referred to as forming a "cladding" around the nanowire. The source/drain features including epitaxial material 4404A may be substantially similar to the epitaxial source/drain material 1302A as discussed above with reference to FIG. 13. The materials for 4404A and 4204A may be of a suitable composition and/or doping with respect to the associated device type (n-type, p-type). Thus, in embodiments, the materials 4404A and 4204A are different in at least one of composition or doping. For example, in some embodiments, the epitaxial materials 4204A provide a source/drain material suitable for a PFET device; the epitaxial materials 4404A provide a source/drain material suitable for an NFET device. Thus, the source/drain features 4402 and 4404 may be formed in the same or in different processes.

Figure 45A:
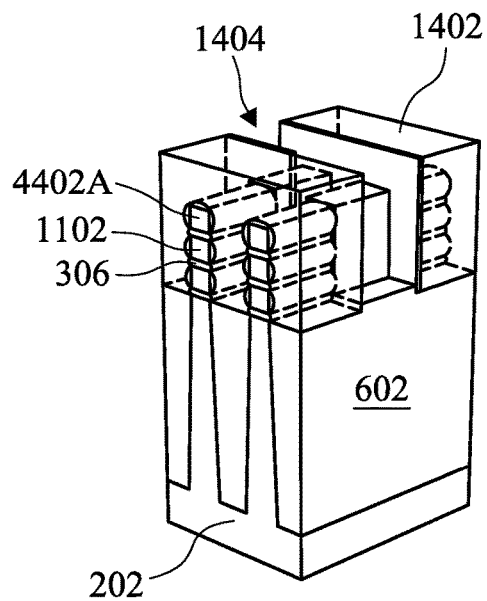
Figure 45B:
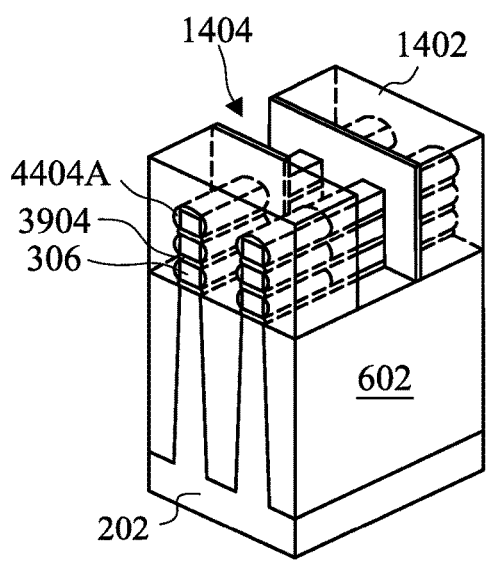
Figure 46A:
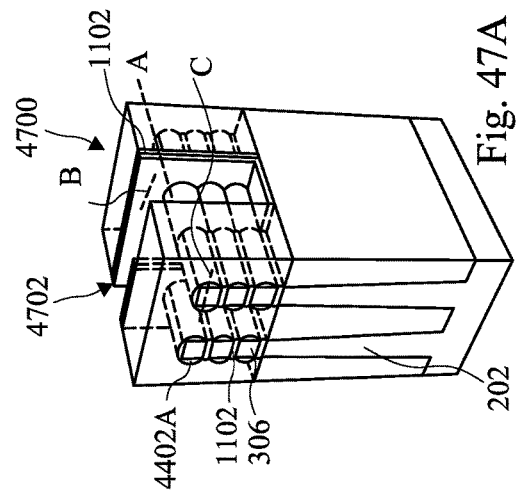
Figure 46B:
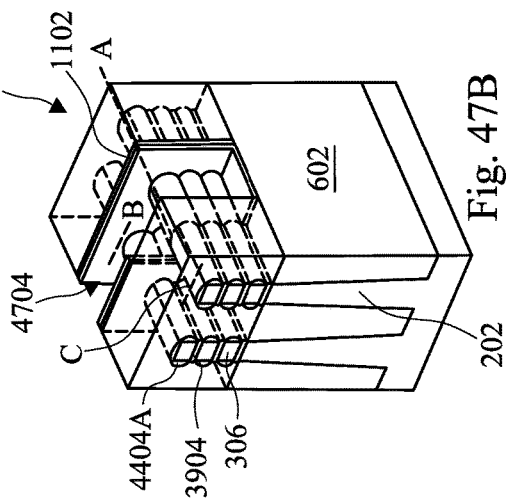
Figure 47A:
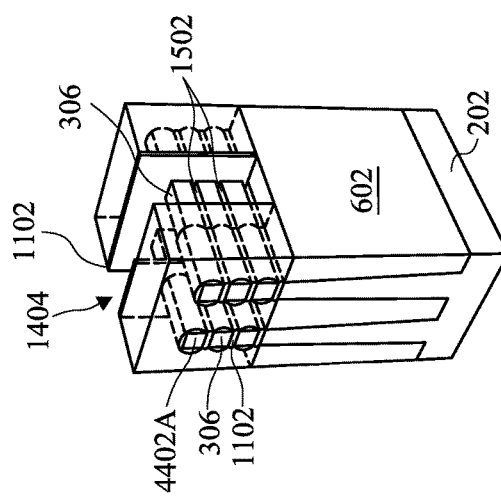
Figure 47B:
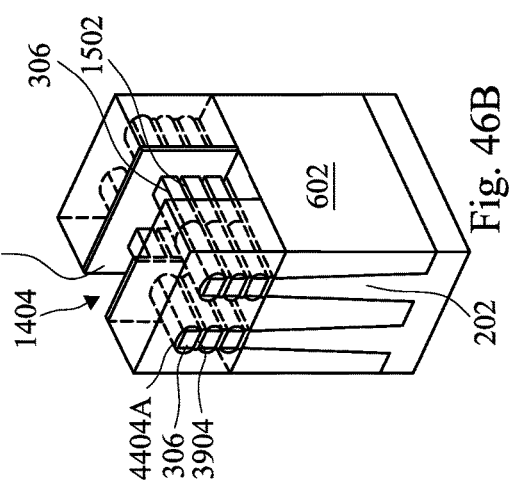

The method 3800 then proceeds to block 3820 where an inter-layer dielectric (ILD) layer is formed. In some embodiments, a CESL layer may also be formed. In some embodiments, the gate structure may also be subsequently removed from the substrate. Block 3820 may be substantially similar to block 120 of the method 100, discussed above with reference to FIG. 1 and the example of FIG. 14, and/or substantially similar to block 2018 of the method 2000 of FIG. 20 and the example of FIG. 32. Referring to the example of FIGS. 45A/45B, an ILD layer 1402 is formed over the substrate 202. As illustrated in FIGS. 45A/45B, the removal of the electrode layer 904 (or the electrode layer 904 and dielectric layer 802) from the gate stack 902 results in a trench 1404. While FIG. 45A illustrates an interim process wherein the dielectric layer 802 is disposed in the trench 1404, in other embodiments, the dielectric layer 802 is also removed.

The method 3800 then proceeds to block 3822 where a selective removal of the epitaxial layer(s) in the channel region of the device(s) is provided. In embodiments, the selected epitaxial layer(s) are removed in the region of the fin element upon and over which the gate structure will be formed, in other words, the channel region. This selective removal may be performed for both types of devices concurrently, or in separate steps including suitable masking elements. Block 3822 may be substantially similar to block 2020 of the method 200 of FIG. 20 and/or the example of FIG. 33, and/or be substantially similar to block 122 of the method 100 of FIG. 1 and/or the example of FIG. 15. Referring to the example of FIGS. 46A/46B, the epitaxy layers 304 are removed from the channel region of the substrate 202 and within the trench 1404 for both types of devices (n-type and p-type). As discussed above, in an embodiment, the epitaxial layers 304 are SiGe and the epitaxial layers 306 are silicon allowing for the selective removal of the SiGe epitaxial layers 304. It is noted that during the processing stage of block 3822 (e.g., FIGS. 46A/B), gaps 1502 are provided between the adjacent nanowires in the channel region (e.g., gaps 1502 between epitaxy layers 306).

The method 3800 then proceeds to block 3824 where one or more gate structures are formed. The gate structures formed may include high-K/metal gate stacks. Block 3824 may be substantially similar to block 2022 of the method 2000 described above with reference to FIGS. 20, 34, 35, 36, and 37 and/or may be substantially similar to block 124 of the method 100, described above with reference to FIG. 1 and/or the examples of 16, 17, 18, and 19. The gate structures formed for the first device type may be different in composition, configuration, number of layers, and the like than those gate structures for the second device type as each provides a relevant work function. Referring to the example of FIG. 47A, in an embodiment of block 3824, a gate stack 4702 is formed within the trench 1404 of the device of the first type. The gate stack 4702 may include interfacial layers, gate dielectric (e.g., high-k) layers 4706, and gate electrode (e.g., metal gate) 4710. Referring to the example of FIG. 47B, in an embodiment of block 3824, a gate stack 4704 is formed within the trench 1404 of the device of the second type. The gate stack 4704 may include interfacial layers, gate dielectric (e.g., high-k) layers 4706, and gate electrode (e.g., metal gate) 4712. The gate stacks 4702 and 4704 may include different compositions and/or be formed in during different processes for each of the interfacial layer, high-k layer, and gate electrode. The gate stack 4702 provides a suitable work function for a first device type (e.g., PFET). The gate stack 4704 provides a suitable work function for a second device type (e.g., NFET). For example, a metal layer of gate stacks 4702 and 4704 may include the same or different compositions including those selected from the group consisting of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof.

Thus, the method 3800 provides in some embodiments a device 4700 of a first type. In some embodiments, the device 4700 is a PFET device. The method 3800 provides in some embodiments a device 4710 of a second type. In some embodiments, the device 4710 is a NFET device. The device 4700 and 4710 may be provided on the same substrate and function together to form an integrated circuit. As discussed above, an advantage of some embodiments of the method 3800 and/or the device 4710 is a strain enhancement provided by the oxidized layer interposing the cladded epitaxial source/drain, see oxidized layer 3904.

The devices 4700 and/or 4710 may perform as a gate-all-around (GAA) device, the respective gate structure 4702/4704 being formed on multiple sides of the nanowire (epitaxy layer 306) in the channel region. The multi-gate device 4700 is illustrated in isometric view in FIG. 47A and corresponding cross-sectional views in FIG. 48A (cross-sectional cut A), FIG. 49A (cross-sectional cut B through the gate structure 4702), FIG. 50A (cross-sectional cut C through the source/drain). The multi-gate device 4710 is illustrated in isometric view in FIG. 47B and corresponding cross-sectional views in FIG. 48B (cross-sectional cut A), FIG. 49B (cross-sectional cut B through the gate structure 4702), FIG. 50B (cross-sectional cut C through the source/drain). The ILD layer 1402 is removed for ease of reference in FIGS. 48A, 49A, 50A. As illustrated in FIGS. 48A, 49A, 48B, 49B, the gate dielectric layer 4706 is disposed below the epitaxial layer 306 (e.g., nanowire). However, in other embodiments, other portions of the respective gate structure 4702, 4704 (e.g., gate electrode 4710, 4712) may also be disposed under the epitaxy layer 306. In some embodiments, the device 4700 and/or 4710 may be a FINFET device having a gate formed on at least two-sides of the channel region (e.g., top and two sidewalls) and/or have other configurations known in the art. The device 4700 and 4710 in FIG. 50A, 50B illustrates the source/drain feature 4402, 4404 having the epitaxially grown cladding layer 4402A, 4404A disposed on multiple surfaces of the epitaxy layer 306 (e.g., nanowire) while dielectric materials (spacer 1102 and oxidized layer 3904 respectively) interpose the epitaxy layers 306 in the source/drain region.

The semiconductor devices 4710 and 4700 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In some embodiments, interconnect features electrically connect the devices 4710 and 4700. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 3800, and some process steps described above may be replaced or eliminated in accordance with various embodiments of the method 3800.

Figure 51:
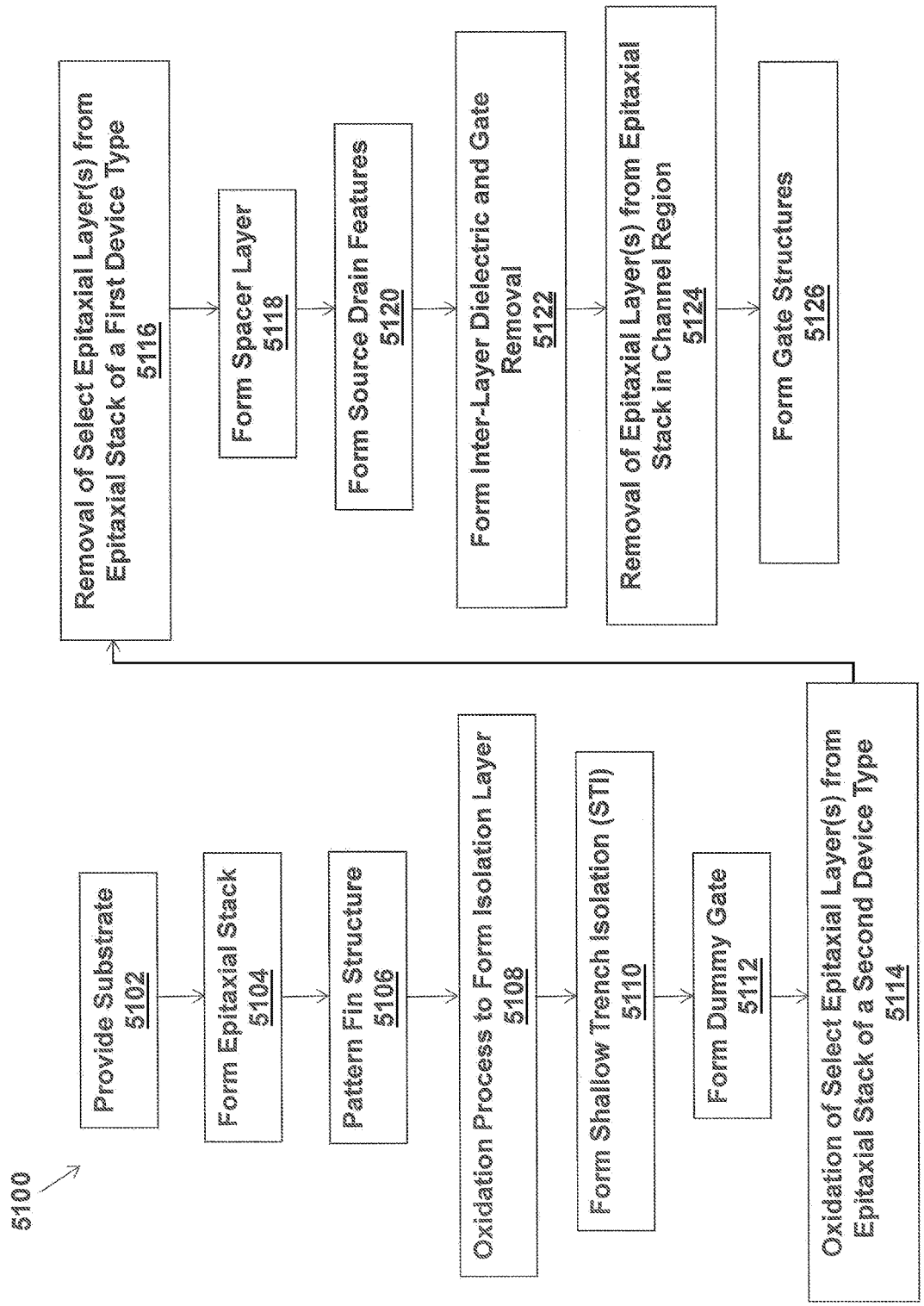
FIG. 51 is a flow chart of a method of fabricating each n-type and p-type multi-gate devices or portion thereof according to one or more aspects of the present disclosure.

Illustrated in FIG. 51 is a method 5100 of semiconductor fabrication including fabrication of multi-gate devices. The method 5100 may be substantially similar to many aspects of the method 100 of FIG. 1, the method 2000 of FIG. 20, and/or the method 3800 of FIG. 38, except with some differences highlighted below. However, the description of similar processes and elements (as illustrated by the common numerical indicators) provided above with reference to the method 100, the method 2000, and/or the method 3800 apply equally herein unless noted otherwise. Like the method 3800 above, the method 5100 illustrates concurrent processing stages for devices of a first and second type. However, the method 5100 also provides in some embodiments for the formation of an isolation layer underlying the channel and source/drain regions of the fin to provide blocking of unwanted diffusion in either or both of the device types.

Figure 52A:
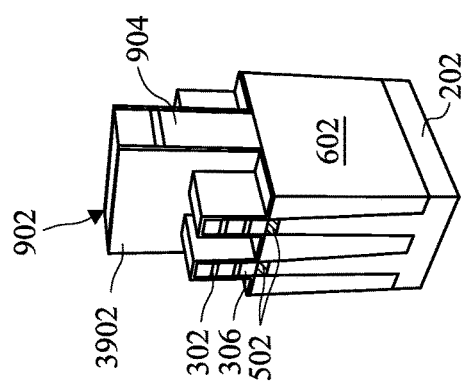

FIGS. 2-9 are isometric views of an embodiment a semiconductor device that also apply to various stages of the method 5100. (These figures can be applied to processing of both types of devices concurrently and/or substantially similarly.) Following the stage of FIG. 9, FIGS. 52A, 52B, 53A, 53B, 54A, 54B, 55A, 55B, 56A, 56B, 57A, 57B, 58A, 58B, 59A, 59B, 60A, and 60B, corresponds to various stages of the method 5100 of FIG. 51. FIGS. 61A, 61B, 62A, 62B, 63A, and 63B are cross-sectional views, corresponding to respective isometric views listed above. These figures provide for a method of implementing teachings of the method 5100 with respect to devices of a different type (e.g., n-type and p-type) formed on a semiconductor substrate. It is noted again that the FIG. designated "A" (e.g., FIG. 52A represents a first type of device (e.g., p-type FET) and the FIG. designated "B" (e.g., 52B) represents a second type of device (e.g., n-type FET) at the corresponding stage. Each device type, e.g., that represented by the "A" figure and that represented by the "B" figure may be formed on the same substrate (e.g., substrate 202). One or more isolation features may interpose the devices of a first type from those of a second type.

The method 5100 begins with blocks 5202, 5204, 5206, 5208, 5210, and 5212 where a substrate is provided and steps including forming epitaxial stacks, fin elements, an oxidation layer, shallow trench isolation features, and dummy gates. Each of these blocks 5202, 5204, 5206, 5208, 5210, and 5212 are substantially similar to the respective blocks 102, 104, 106, 108, 110 and 112 of the method 100, described above with reference to FIG. 1 and FIGS. 2, 3, 4, 5, 6, 7, 8, and 9, respectively. While a single exemplary device is illustrated, the processing of one or more of these blocks may be concurrently performed for a device of a first type and a device of a second type.

Similar to as described above with reference to the method 100 at block 108, the method 5100, at block 5108, provides for formation of an insulating layer formed in a fin(s). This insulating layer, illustrated as oxidized layer 502, can serve as a diffusion barrier to APT dopants previously implanted into the substrate 202, and which may be present in the substrate 202 directly below the oxidized layer 502. Thus, in various embodiments, the oxidized layer 502 serves to prevent APT dopants within the substrate portion 202 from diffusing for example, into the overlying epitaxial layer(s) 306, which can serve as a channel region for a subsequently formed multi-gate device. It is noted that as illustrated the oxidized layer 502 is formed for each device type (n-type and p-type). However, in other embodiments, the oxidized layer 502 may be provided only on a single device type while the other device type may be processed without an oxidized layer (e.g., as illustrated in the method 2000 and/or 3800 described above with reference to FIGS. 20 and 38 respectively. In some embodiments, the oxidized layer (see, e.g., FIG. 6) formed in the method 5100 at block 108 is between approximately 5 and 15 nm.

After the method 5100 performs block 5112, the method 5100 proceeds to block 5114 where select epitaxial layers of the epitaxy stack on device(s) of a second type are oxidized, while the fins of the device(s) of a first type are protected by a masking layer. In an embodiment, the fins or fin regions corresponding to a PFET are covered by the masking layer, while select epitaxial layers of the source/drain region of the NFET are oxidized. In some embodiments, the masking layer includes a hard mask having an oxide layer (e.g., a pad oxide layer that may include $SiO_2$) and/or nitride layer (e.g., a pad nitride layer that may include $Si_3N_4$). In some examples, the masking layer includes thermally grown oxide, CVD-deposited oxide, and/or ALD-deposited oxide. In some embodiments, the masking layer includes a nitride layer deposited by CVD or other suitable technique.

While the fins of the device(s) of a first type are protected, an oxidation process is performed on select epitaxial layers of the fins of the device(s) of the second type. In some embodiments, the SiGe epitaxial layers of the epitaxial stack on the fins in the region having the second type of devices are oxidized (e.g., fully oxidized). The substrate including the devices of each of the first and second types can be subjected to a wet oxidation process, a dry oxidation process, or a combination thereof. In at least some embodiments, the device(s) are exposed to a wet oxidation process using water vapor or steam as the oxidant.

Figure 52B:
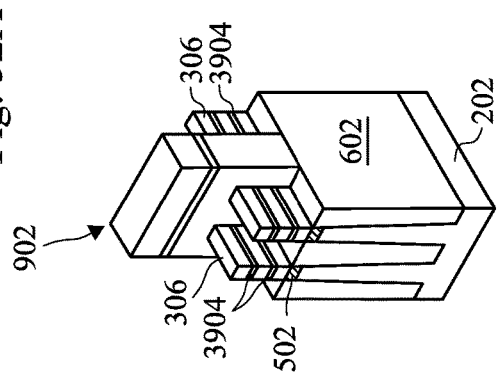

Referring to the example of FIG. 52A, a device of a first type (e.g., PFET) has a hard mask layer 3902 disposed thereon. While the HM layer 3902 is disposed on the device of the first type, an oxidation process is performed on the epitaxial layers 304 of the source/drain region of the fins of the device(s) of the second type as illustrated in FIG. 52B. In some embodiments, the materials of the epitaxial layers 304, 306 have different oxidation rates therefore allowing for a selective oxidation process. For example, in some embodiments, the epitaxial layers 304 are SiGe and the epitaxial layers 306 are Si. The SiGe can oxidize at a much higher rate than the Si. Using FIG. 52A as an example, in an embodiment, the epitaxial layers 304 are SiGe and result in an oxidized layer 3904 of SiGeOx. In some embodiments, the epitaxial layers 306 are not oxidized. As described above, in some embodiments, the bottom epitaxy layer 304 in the second device type was previously oxidized to form oxidized layer 502. In some embodiments, oxidized layer 502 has a greater thickness than oxidized layers 3904. In some embodiments, both oxidized layer 502 and oxidized layer 3904 are SiGeOx.

In an embodiment, the thickness of the epitaxial layer 304 in the source/drain region is between approximately 2 and 6 nm, for example, as illustrated in FIGS. 2-9. Upon oxidation of the epitaxial layer 304 in the source/drain region of the second type of device, the layer may expand to provide a thickness of the oxidized layer 3904 between approximately 5 and 15 nanometers. This expansion can provide for a stress (e.g., resulting in a bending) applied to the epitaxial layers 306 of the source drain region of the fins 402 of the device of the second type. This is illustrated in FIG. 62B where the epitaxial layers 306 are no longer coplanar (or collinear) between the channel region (under the gate) and the source/drain region. It is noted that the epitaxial layers 306 remain a substantially consistent thickness between the source/drain region and the channel region (e.g., between 6 and 12 nanometers). This can provide for a strain enhancement of the device which may be beneficial for example for NMOS devices. The bottom layer, oxidized layer 502, in the second device region may be thicker that the oxidized layers 3904. In some embodiments, the oxidized layer 502 in the second device region is between approximately 5 nm and 25 nm.

In some embodiments, block 5114 continues to provide for the removal of the hard mask layer on the first device type. Using the example of FIGS. 53A/53B, the hard mask layer 3902 is removed from the substrate 202.

Figure 54A:
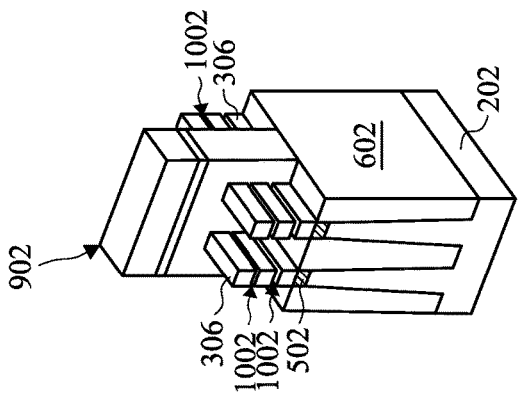
FIGS. 52A, 53A, 54A, 55A, 56A, 57A, 58A, 59A, 60A are isometric views of an embodiment of a device of a first type according to aspects of the method of FIG. 51.
Figure 54B:
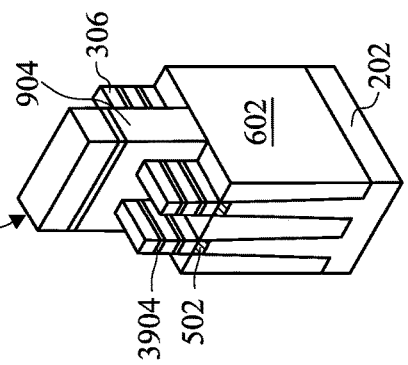
FIGS. 52B, 53B, 54B, 55B, 56B, 57B, 58B, 59B, 60B are isometric views of an embodiment of a device of a second type according to aspects of the method of FIG. 51.
Figure 53A:
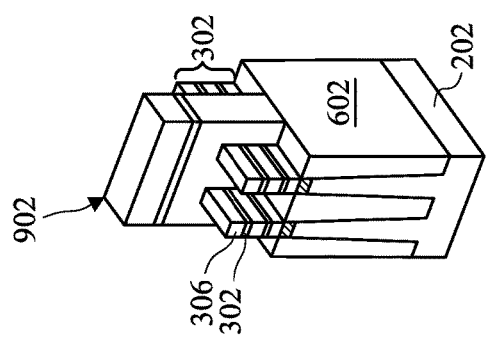
Figure 53B:
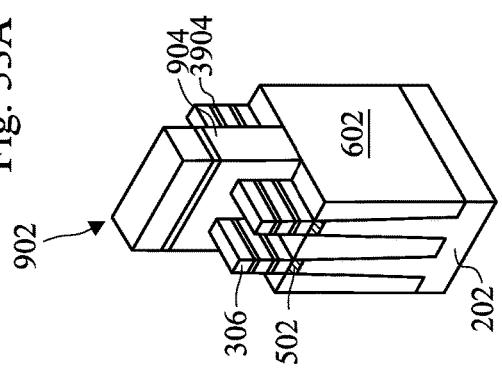

The method 5100 then proceeds to block 5116 where select epitaxial layers of the epitaxy stack are removed from the fin region adjacent the gate stack, source/drain region, in the fins of the device(s) of a first type (e.g., PFET). Block 5116 may be substantially similar to block 3814 of the method 3800, described above with reference to FIG. 38, block 114 of the method 100 of FIG. 1, and/or block 2012 of the method 2000 of FIG. 20. As illustrated in FIG. 54A/54B, the epitaxial layers 304 have been removed from the substrate 202 in the source/drain region of the fins 402 for the first device type (FIG. 54A). The second device type (FIG. 54B) remains substantially unchanged. FIG. 54A illustrates gaps 1002 in the place of the epitaxial layers 304 (FIG. 53A). The gaps 1002 may be filled with the ambient environment (e.g., air, $N_2$). In some embodiments, the selectivity between the epitaxial layer 304 and the oxidized layer 3904 (oxidized epitaxial layer 304) allows for selective removal of the epitaxial layer 304 from the first device type.

Figure 55A:
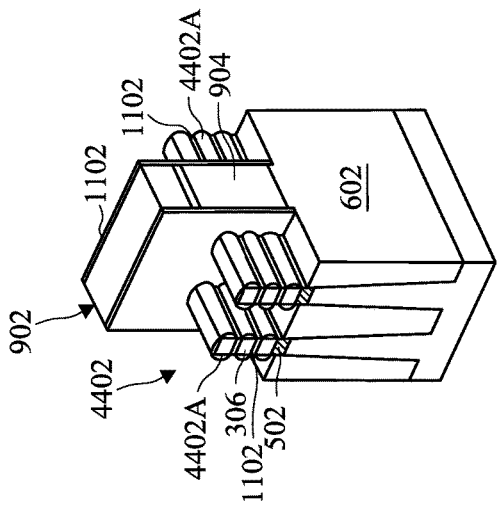
Figure 55B:
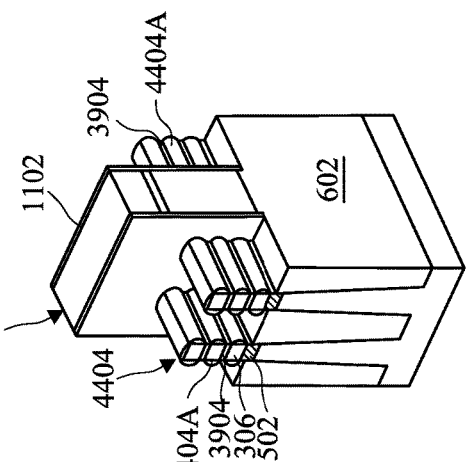
Figure 56A:
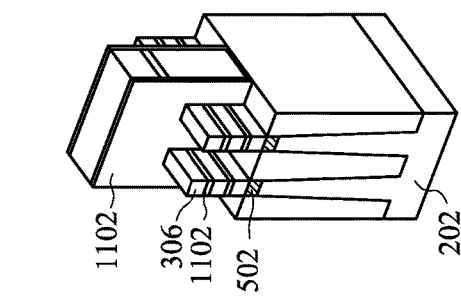
Figure 56B:
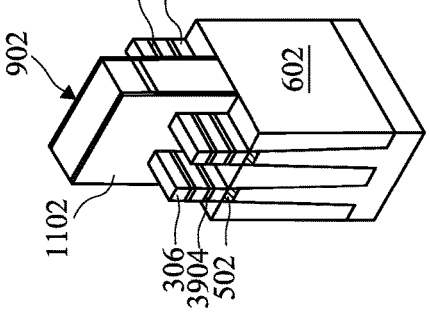

The method 5100 proceeds to block 5118 where a spacer layer is deposited on the substrate over the fins of both device types. Block 5100 may be substantially similar to block 3816 of the method 3800, described above with reference to FIG. 38 and FIGS. 39A/39B, block 116 of the method 100, described above with reference to FIGS. 1 and 11, and/or block 2014 of the method 2000 described above with reference to FIG. 20. FIGS. 55A/55B illustrate a spacer layer 1102 disposed on the fins 402. With respect to devices of the first type, FIG. 55A illustrates the spacer layer 1102 is formed including filling in the gaps 1002. In some embodiments, with reference to the example of FIGS. 56A/56B, after formation of the spacer layer 1102, the spacer layer 1102 may be etched-back to expose portions of the fin elements 402 adjacent to and not covered by the gate structure 902 (e.g., source/drain regions). The example of FIG. 56A may be substantially similar to as discussed above with reference to FIGS. 12A and 12B. As discussed above, while the spacer layer 1102 may be removed from a top surface of the epitaxial stack 2202 and the lateral surfaces of the epitaxial stack 2202, as illustrated in FIG. 56A, the spacer layer 1102 remains interposing the epitaxial layers 306 of the epitaxial stack 302 in the source/drain region of the first type of device and on the sidewalls of the gate. The spacer layer 1102 between the epitaxial layers 306 in the fins 402 of the device(s) of the first type may be between approximately 2-6 nm in thickness. Meanwhile with reference to devices of the second type, FIG. 56B is illustrative of the spacer layer 1102 being etched-back such that it remains on the sidewalls of the gate structure 902 forming spacer elements.

Figure 57A:
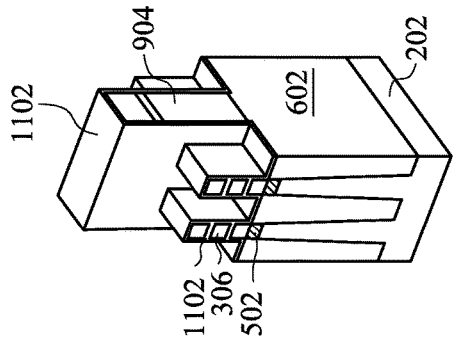
Figure 57B:
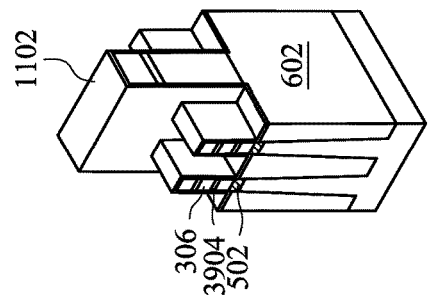
Figure 58A:
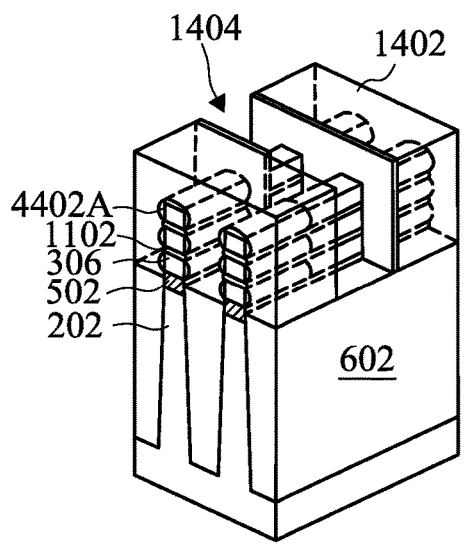
Figure 58B:
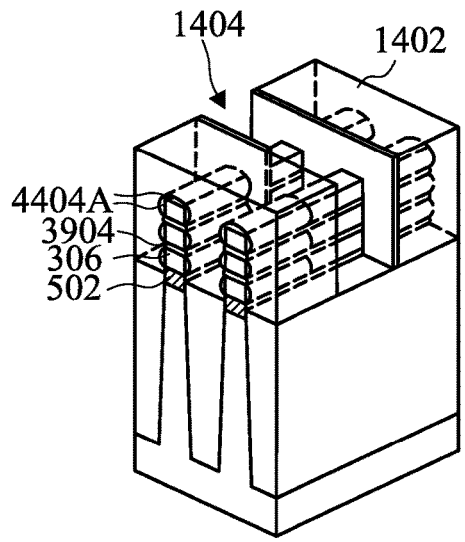

The method 5100 then proceeds to block 5120 where source/drain features are formed. Block 5120 may be substantially similar to block 3818 of the method 3800, described above with reference to FIGS. 38, 44A, 44B, block 2016 of the method 2000, described above with reference to FIGS. 20 and 31, and/or may be substantially similar to block 118 of the method 100, described above with reference to FIG. 1. As discussed above, the source/drain features may be formed by performing an epitaxial growth process that provides an epitaxy material cladding the portions of the epitaxy layers in the fins' source/drain regions. Referring to the example of FIG. 57A/57B, source/drain features 4402 and 4404 are formed on the fin element 402 adjacent the gate structure 902 for each device type. Referring to FIG. 57A, the source/drain features 4402 include material 4402A formed by epitaxially growing a semiconductor material layer on the region of the epitaxial layer 306 adjacent the gate structure 902. In other words, the material 4402A is formed around the nanowire (e.g., epitaxy layer 306) adjacent the gate; this may be referred to as forming a "cladding" around the nanowire. The source/drain features including epitaxial material 4402A may be substantially similar to as discussed above with reference to FIG. 44A, and/or substantially similar to the epitaxial source/drain material 1302A as discussed above with reference to FIG. 13. Referring to FIG. 57B, the source/drain features 4404 include material 4404A formed by epitaxially growing a semiconductor material layer on the region of the epitaxial layer 306 adjacent the gate structure 902. In other words, the material 4404A is formed around the nanowire (e.g., epitaxy layer 306) adjacent the gate; this may be referred to as forming a "cladding" around the nanowire. The source/drain features including epitaxial material 4404A may be substantially similar to as described above with reference to FIG. 44B, and/or substantially similar to the epitaxial source/drain material 1302A as discussed above with reference to FIG. 13. The materials for 4404A and 4204A may be of a suitable composition and/or doping with respect to the associated device type (n-type, p-type). Thus, in embodiments, the materials 4404A and 4204A are different in at least one of composition or doping. For example, in some embodiments, the epitaxial materials 4204A provide a source/drain material suitable for a PFET device; the epitaxial materials 4404A provide a source/drain material suitable for an NFET device. Thus, the source/drain 4402 and 4404 may be formed in the same or in different processes.

Figure 59A:
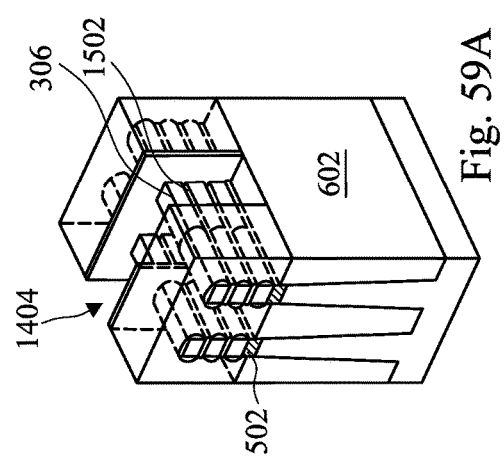
Figure 59B:
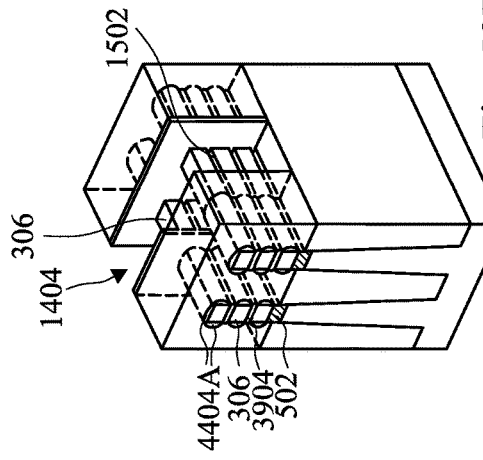
Figure 60A:
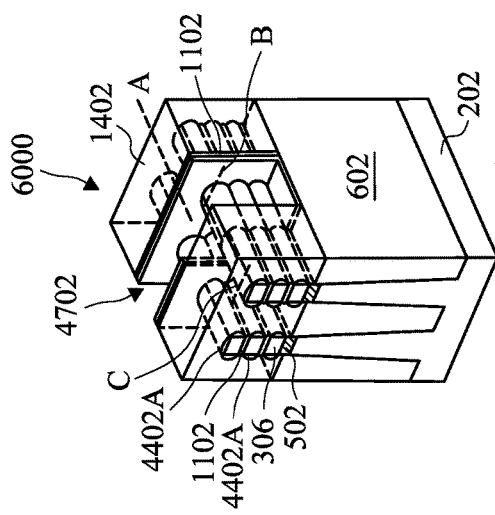
Figure 60B:
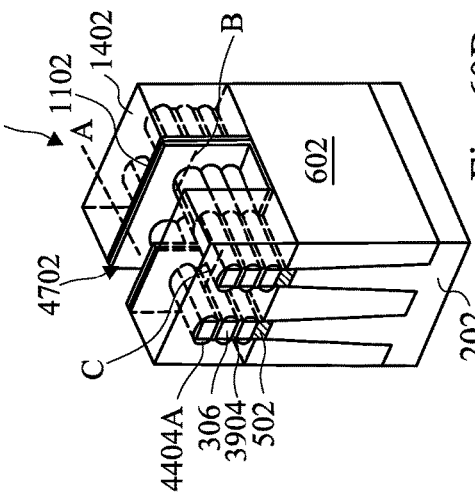

The method 5100 then proceeds to block 5122 where an ILD layer is formed and/or the gate structure is removed. Block 5122 may be substantially similar to block 3820 of the method 300, block 2018 of the method 200, and/or block 120 of the method 100. Referring to the example of FIGS. 58A/58B, an ILD layer 1402 is formed over the substrate 202. As illustrated in FIGS. 59A/59B, the removal of the electrode layer 904 (or the electrode layer 904 and dielectric layer 802) results in a trench 1404.

The method 5100 then proceeds to block 5124 where a selective removal of the epitaxial layer(s) in the channel region of the device(s) is provided. In embodiments, the selected epitaxial layer(s) are removed in the region of the fin element on and over which the gate structure will be formed, in other words, the channel region. This selective removal may be performed for both types of devices concurrently, or in different processing steps that provide for suitable masking. Block 5124 may be substantially similar to block 3822 of the method 3800, block 2020 of the method 200 of FIG. 20 and/or the example of FIG. 33, and/or block 122 of the method 100 of FIG. 1 and/or the example of FIG. 15. Referring to the example of FIGS. 59A/59B, the epitaxy layers 304 are removed from the channel region of the substrate 202 and within the trench 1404 for both types of devices (n-type and p-type). As discussed above, in some embodiments, the epitaxial layers 304 are SiGe and the epitaxial layers 306 are silicon allowing for the selective removal of the SiGe epitaxial layers 304. It is noted that during the interim processing stage of block 5124 (e.g., FIGS. 59A/59B), gaps 1502 are provided between the adjacent nanowires in the channel region (e.g., gaps 1502 between epitaxy layers 306).

The method 5100 then proceeds to block 5126 where gate structures are formed. Block 5126 may be substantially similar to block 3824 of the method 3800, block 2022 of the method 2000 described above with reference to FIGS. 20, 34, 35, 36, and 37 and/or may be substantially similar to block 124 of the method 100, described above with reference to FIG. 1 and/or the examples of 16, 17, 18, and 19. Referring to the example of FIG. 60A, in an embodiment of block 5126, a gate stack 4702 is formed within the trench 1404 of the device of the first type. Referring to the example of FIG. 60B, in an embodiment of block 3824, a gate stack 4704 is formed within the trench 1404 of the device of the second type. The gate stacks 4702 and 4704 may include different compositions and/or be formed in during processes. Either or both of the gate stacks 4702 and 4704 may be high-K/metal gate stacks. The gate stack 4702 provides a suitable work function for a first device type (e.g., PFET). The gate stack 4704 provides a suitable work function for a second device type (e.g., NFET). For example, a metal layer of gate stacks 4702 and 4704 may include the same or different compositions including those selected from the group consisting of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof.

Thus, the method 5100 provides in some embodiments a device 6000 of a first type. In some embodiments, the device 6000 is a PFET device. The method 5100 provides in some embodiments a device 6010 of a second type. In some embodiments, the device 6010 is a NFET device. The device 6000 and 6010 may be provided on the same substrate and function together to form an integrated circuit. As discussed above, an advantage of some embodiments of the method 5100 and/or the device 6110 is a strain enhancement provided by the increased thickness of the oxidized layer interposing the cladded epitaxial source/drain, see oxidized layer 3904. In some embodiments, an advantage of the device 6000 is the presence of an oxidized layer 502 under the channel and/or source/drain regions. In some embodiments, an advantage of the device 6010 is the presence of an oxidized layer 502 under the channel and/or source/drain regions.

The devices 6000 and/or 6010 may perform as a gate-all-around (GAA) device, the gate structure 4702/4704 being formed on multiple sides of the nanowire (epitaxy layer 306). The multi-gate device 6000 is illustrated in isometric view in FIG. 60A and corresponding cross-sectional views in FIG. 61A (cross-sectional cut A), FIG. 62A (cross-sectional cut B through the gate structure 4702), FIG. 63A (cross-sectional cut C through the source/drain). The multi-gate device 6010 is illustrated in isometric view in FIG. 60B and corresponding cross-sectional views in FIG. 61B (cross-sectional cut A), FIG. 62B (cross-sectional cut B through the gate structure 4702), FIG. 63B (cross-sectional cut C through the source/drain). The ILD layer 1402 is removed for ease of reference in FIGS. 61A/B, 62A/B, 63A/B. As illustrated in FIGS. 61A, 62A, 61B, 62B, the gate dielectric layer 4706 is disposed below the epitaxial layer 306 (e.g., nanowire). However, in other embodiments, other portions of the respective gate structure 4702, 4704 (e.g., gate electrode 4710, 4712) may also be disposed under the epitaxy layer 306. In some embodiments, the device 6000 and/or 6010 may be a FINFET device having a gate formed on at least two-sides of the channel region (e.g., top and two sidewalls) and/or have other configurations known in the art. The device 6000 and 6010 in FIGS. 63A, 63B illustrates the source/drain feature 4402, 4404 having the epitaxially grown cladding layer 4402A, 4404A disposed on multiple surfaces of the epitaxy layer 306 (e.g., nanowire) while dielectric material (spacer layer 1102 and oxidized layer 3904 respectively) interposes the epitaxy layers 306.

The semiconductor devices 6000 and 6010 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 5100, and some process steps described above may be replaced or eliminated in accordance with various embodiments of the method 5100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Thus, in one of the broader embodiments, a method of semiconductor device fabrication is described that includes forming a fin extending from a substrate and having a source/drain region and a channel region. The fin includes a first epitaxial layer having a first composition and a second epitaxial layer on the first epitaxial layer, the second epitaxial layer having a second composition. The second epitaxial layer is removed from the source/drain region of the fin to form a gap. The gap is filled with a dielectric material. Another epitaxial material is formed on at least two surfaces of the first epitaxial layer to form a source/drain feature.

In an embodiment, a method is presented for fabricating a multi-gate device. The method includes growing an epitaxial layer stack including first, second, and third epitaxial layers. The epitaxial layer stack is patterned to form a fin element. A dummy gate structure is formed over the fin element. The second epitaxial layer in a first region and a second region of the fin is transformed to a dielectric layer. The first and second regions are interposed by a third region of the fin that underlies the dummy gate structure. The dummy gate structure is removed after transforming the second epitaxial layer, thereby forming a trench. A metal gate structure is formed in the trench, wherein the metal gate is disposed on multiple sides of each of the first and third epitaxial layers. In some further embodiments the second epitaxial layer is transformed by oxidizing the second epitaxial layer. In some further embodiments, the second epitaxial layer is transformed by removing the second epitaxial layer to form a gap and filling the gap with a dielectric material.

In another of the embodiments, a multi-gate semiconductor device is formed that provides a first fin element extending from a substrate. A gate structure extends over a channel region of the first fin element. The channel region of the first fin element includes a plurality of channel semiconductor layers each surrounded by a portion of the gate structure. A source/drain region of the first fin element is adjacent the gate structure. The source/drain region includes a first semiconductor layer, a dielectric layer over the first semiconductor layer, and a second semiconductor layer over the dielectric layer.

What is claimed is:

1. A method of semiconductor device fabrication, comprising:
    forming a first fin extending from a substrate, the first fin having a source/drain region and a channel region, wherein the first fin includes a first epitaxial layer having a first composition and a second epitaxial layer on the first epitaxial layer, the second epitaxial layer having a second composition;
    forming a second fin extending from the substrate and having a source/drain region and a channel region, wherein the second fin includes the first epitaxial layer and the second epitaxial layer;
    oxidizing the second epitaxial layer of the second fin, while a hard mask layer protects the first fin;
    removing the second epitaxial layer from the source/drain region of the first fin to form a gap;
    filling the gap with a dielectric material; and
    while the dielectric material is filled within the gap, growing a first source/drain epitaxial material on at least two surfaces of the first epitaxial layer to form a first source/drain feature on the first fin; and
    growing a second source/drain epitaxial material on the first epitaxial layer of the second fin, to form a second source/drain, and wherein the second source/drain epitaxial material are adjacent the oxidized second epitaxial layer.

2. The method of claim 1, further comprising:
    prior to forming the first epitaxial layer, forming a third epitaxial layer underlying the first epitaxial layer;
    oxidizing the third epitaxial layer to form an oxidized third epitaxial layer;
    wherein the oxidized third epitaxial layer underlies a gate on the channel region and the first source/drain feature.

3. The method of claim 1, further comprising:
    removing the second epitaxial layer from the channel region of the first fin to from another gap; and
    forming a gate structure on the first epitaxial layer in the channel region, wherein at least a portion of the gate structure is formed in the another gap.

4. The method of claim 1, further comprising:
    prior to forming the first fin, performing an anti-punch through (APT) ion implantation into the substrate; and
    after performing the APT ion implantation and prior to forming the first fin, depositing the first epitaxial layer over the substrate and the second epitaxial layer over the first epitaxial layer.

5. The method of claim 1, further comprising:
    forming the first epitaxial layer by growing a silicon layer; and
    forming the second epitaxial layer by growing a silicon germanium layer directly on the silicon layer.

6. The method of claim 1, wherein the first epitaxial layer has a first oxidation rate, and wherein the second epitaxial layer has a second oxidation rate greater than the first oxidation rate.

7. The method of claim 1, wherein the oxidized second epitaxial layer is greater in thickness than the second epitaxial layer thereby providing a top surface of the first epitaxial layer in the channel region below a top surface of the first epitaxial layer in the source/drain region of the second fin.

8. The method of claim 1, further comprising:
    forming a gate structure on the first fin, wherein the gate structure is disposed over top, bottom and opposing lateral sides of the first epitaxial layer in the channel region.

9. The method of claim 8, further comprising:
    forming a high-k gate dielectric of the gate structure over the top, bottom and opposing lateral sides of the first epitaxial layer in the channel region.

10. The method of claim 1, wherein a channel of a first type of device is formed in the fin and a channel of a second type of device is formed in the another fin, the first type being one of an NFET and a PFET and the second type being the other one of the NFET and the PFET.

11. A method of fabricating a multi-gate device, the method comprising:
    forming an bottom epitaxial layer;
    growing an epitaxial layer stack including first, second, and third epitaxial layers over the bottom epitaxial layer;
    oxidizing the bottom epitaxial layer to form an oxide layer;

patterning the epitaxial layer stack to form a fin element;
forming a dummy gate structure over the fin element;
transforming the second epitaxial layer in a first region and a second region of the fin to a dielectric layer, wherein the first and second regions are interposed by a third region of the fin, wherein the third region underlies the dummy gate structure, wherein a thickness of the oxide layer is greater than the thickness of the dielectric material;
removing the dummy gate structure after transforming the second epitaxial layer, thereby forming a trench; and
forming a metal gate structure in the trench, wherein the metal gate structure is disposed on multiple sides of each of the first and third epitaxial layers.

12. The method of claim 11, wherein the transforming includes oxidizing the second epitaxial layer in the first region.

13. The method of claim 11, wherein the transforming includes:
removing the second epitaxial layer in the first region to form a gap; and
filling the gap with a dielectric material.

14. The method of claim 11, further comprising:
after removing the dummy gate structure, removing the second epitaxial layer from the third region of the fin to form a gap in the third region.

15. The method of claim 14, wherein a high-k dielectric layer of the metal gate structure is disposed in the gap in the third region.

16. The method of claim 13,
wherein the filling the gap with a dielectric material includes depositing a spacer layer and etching back the spacer layer, wherein the etching back removes the spacer layer from a top surface of the dummy gate structure and sidewalls of the first epitaxial layer, wherein the spacer layer continues to fill the gap after the etching back.

17. The method of claim 16,
wherein the etching back includes removing the spacer layer from a top surface of the third epitaxial layer.

18. The method of claim 16, wherein the spacer layer defines sidewalls of the trench.

* * * * *